(12) United States Patent
Takeshita et al.

(10) Patent No.: US 7,776,511 B2
(45) Date of Patent: Aug. 17, 2010

(54) POSITIVE RESIST COMPOSITION AND METHOD OF FORMING RESIST PATTERN

(75) Inventors: Masaru Takeshita, Kawasaki (JP); Ryoji Watanabe, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 0 days.

(21) Appl. No.: 12/299,523

(22) PCT Filed: May 18, 2007

(86) PCT No.: PCT/JP2007/060249

§ 371 (c)(1),
(2), (4) Date: Nov. 4, 2008

(87) PCT Pub. No.: WO2007/138893

PCT Pub. Date: Dec. 6, 2007

(65) Prior Publication Data

US 2009/0075204 A1    Mar. 19, 2009

(30) Foreign Application Priority Data

May 25, 2006    (JP)    .............................. 2006-145285
Sep. 8, 2006    (JP)    .............................. 2006-244293

(51) Int. Cl.
G03F 7/004    (2006.01)
G03F 7/30    (2006.01)
(52) U.S. Cl. ..................... 430/270.1; 430/326; 430/910
(58) Field of Classification Search .............. 430/270.1, 430/326, 910
See application file for complete search history.

(56) References Cited

U.S. PATENT DOCUMENTS

| 5,945,517 | A | 8/1999 | Nitta et al. |
| 6,153,733 | A | 11/2000 | Yukawa et al. |
| 7,323,287 | B2 | 1/2008 | Iwai et al. |

FOREIGN PATENT DOCUMENTS

| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | 2006-106265 | 4/2006 |
| WO | WO 2004-074242 | 9/2004 |

OTHER PUBLICATIONS

International Search Report in connection with corresponding PCT application No. PCT/JP2007/060249, dated May 18, 2007.

Primary Examiner—John S Chu
(74) Attorney, Agent, or Firm—Knobbe, Martens, Olson & Bear, LLP

(57) ABSTRACT

A positive resist composition including a resin component (A) which exhibits increased alkali solubility under action of acid and an acid-generator component (B) which generates acid upon exposure, the resin component (A) including a structural unit (a0-1) represented by general formula (a0-1) shown below and a structural unit (a0-2) represented by general formula (a0-2) shown below:

[Chemical Formula 1]

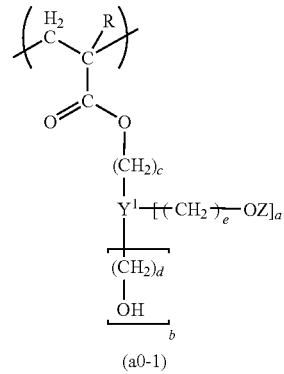

(a0-1)

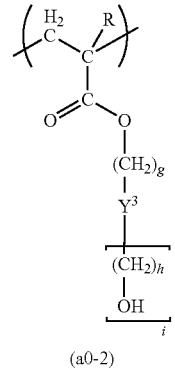

(a0-2)

wherein: R represents a hydrogen atom, a halogen atom, a lower alkyl group or a halogenated lower alkyl group; each of $Y^1$ and $Y^3$ independently represents an aliphatic cyclic group; Z represents a tertiary alkyl group-containing group or an alkoxyalkyl group; a represents an integer of 1 to 3, and b represents an integer of 0 to 2, such that a+b=1 to 3; each of c, d and e independently represents an integer of 0 to 3; each of g and h independently represents an integer of 0 to 3; and i represents an integer of 1 to 3.

16 Claims, No Drawings

POSITIVE RESIST COMPOSITION AND METHOD OF FORMING RESIST PATTERN

RELATED APPLICATIONS

This application is the U.S. National Phase filing under 35 U.S.C. §371 of PCT/JP2007/060249, filed May 18, 2007, which designated the United States and was published in a language other than English, which claims priority under 35 U.S.C. §119(a)-(d) to Japanese Patent Application No. 2006-145285, filed May 25, 2006, and Japanese Patent Application No. 2006-244293, filed Sep. 8, 2006. The contents of these applications are incorporated herein by reference in their entireties.

TECHNICAL FIELD

The present invention relates to a positive resist composition and a method of forming a resist pattern.

Priority is claimed on Japanese Patent Application No. 2006-145285, filed May 25, 2006, and Japanese Patent Application No. 2006-244293, filed Sep. 8, 2006, the contents of which are incorporated herein by reference.

Priority is claimed on Japanese Patent Application No. 2006-145285, filed May 25, 2006, and Japanese Patent Application No. 2006-244293, filed Sep. 8, 2006, the contents of which are incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film. A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production of semiconductor elements. Furthermore, research is also being conducted into lithography techniques that use an exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources. As a resist material which satisfies these conditions, a chemically amplified resist is used, which includes a base resin that exhibits a changed alkali solubility under action of acid and an acid generator that generates acid upon exposure. For example, a chemically amplified positive resist contains, as a base resin, a resin which exhibits increased alkali solubility under action of acid, and an acid generator. In the formation of a resist pattern, when acid is generated from the acid generator upon exposure, the exposed portions become alkali soluble.

Currently, chemically amplified resins that contain structural units derived from (meth)acrylate esters within the main chain (acrylic resins) are widely used as base resins for resists that use ArF excimer laser lithography, as they exhibit excellent transparency in the vicinity of 193 nm (for example, see Patent Document 1). Further, as acrylic resins for use in such application, those which have a structural unit derived from (meth)acrylate ester having an aliphatic polycyclic group such as an adamantane skeleton at the ester portion are generally used, as they exhibit excellent transparency in the vicinity of 193 nm and excellent dry-etching resistance.

Further, for improving the lithography properties, those which have plurality of structural units are currently used as the base resin component of chemically amplified resists. For example, a positive resist has a structural unit containing an acid dissociable, dissolution inhibiting group which is dissociable under action of acid generated from the acid generator, and also has a structural unit containing a polar group such as a hydroxyl group, a structural unit containing a lactone structure, and the like. In particular, a structural unit containing a polar group is widely used, as it enhances the affinity of the resist for an alkali developing solution, and contributes to improvement in the resolution. For example, in an acrylic resin, a (meth)acrylate ester having a hydroxyl group-containing aliphatic polycyclic group at the ester portion, such as a structural unit derived from hydroxyadamantyl(meth)acrylate, is generally used.

Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

[Patent Document 1] Japanese Unexamined Patent Application, First Publication No. 2003-241385

DISCLOSURE OF INVENTION

Problems to be Solved by the Invention

However, as such base resins have a polar group such as a hydroxyl group, such base resins are disadvantageous in that they exhibit poor solubility in an organic solvent. Such poor solubility of the base resin in an organic solvent causes disadvantages such as labor and time in preparation of a resist solution, low stability of a resist solution prepared, and the like. Further, problems are caused in the synthesis of the base resin. For example, when synthesis of a resin is conducted using a monomer exhibiting high polarity, such as the aforementioned hydroxyadamantyl(meth)acrylate, the viscosity of the generated polymer becomes higher as the amount of the monomer added is increased, and hence, it becomes difficult to purify the generated polymer. Therefore, there is a large limitation in the amount of the monomer exhibiting high polarity, such as hydroxyadamantyl (meth)acrylate.

For avoiding the aforementioned problem, the use of a resin which does not have a structural unit containing a polar group has been considered. However, when such a resin is used, the shape of a resist pattern formed is deteriorated.

The present invention takes the above circumstances into consideration, with an object of providing a positive resist composition which exhibits excellent solubility in an organic solvent and is capable of forming a resist pattern having an excellent shape, and a method of forming a resist pattern.

Means for Solving the Problems

As a result of extensive studies, present inventors have found that the aforementioned problems can be solved by using a resin containing two specific structural units. The present invention has been completed, based on this finding.

Specifically, a first aspect of the present invention is a positive resist composition including a resin component (A) which exhibits increased alkali solubility under action of acid and an acid-generator component (B) which generates acid upon exposure, the resin component (A) including a structural unit (a0-1) represented by general formula (a0-1) shown below and a structural unit (a0-2) represented by general formula (a0-2) shown below:

[Chemical Formula 1]

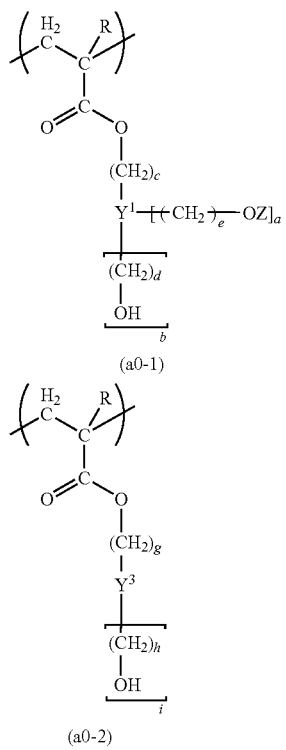

wherein:

in general formula (a0-1), R represents a hydrogen atom, a halogen atom, a lower alkyl group or a halogenated lower alkyl group; $Y^1$ represents an aliphatic cyclic group; Z represents a tertiary alkyl group-containing group or an alkoxyalkyl group; a represents an integer of 1 to 3, and b represents an integer of 0 to 2, such that a+b=1 to 3; and each of c, d and e independently represents an integer of 0 to 3, and in general formula (a0-2), R represents a hydrogen atom, a halogen atom, a lower alkyl group or a halogenated lower alkyl group; $Y^3$ represents an aliphatic cyclic group; each of g and h independently represents an integer of 0 to 3; and i represents an integer of 1 to 3.

A second aspect of the present invention is a method of forming a resist pattern, including: applying a positive resist composition of the first aspect to a substrate to form a resist film on the substrate; subjecting the resist film to exposure; and developing the resist film to form a resist pattern.

In the present description and claims, the term "structural unit" refers to a monomer unit that contributes to the formation of a resin component (polymer).

An "alkyl group" includes linear, branched or cyclic, monovalent saturated hydrocarbon, unless otherwise specified.

An "alkylene group" includes linear, branched or cyclic, divalent saturated hydrocarbon, unless otherwise specified.

A "lower alkyl group" is an alkyl group of 1 to 5 carbon atoms.

The term "exposure" is used as a general concept that includes irradiation with any form of radiation.

Effects of the Invention

According to the present invention, there are provided a positive resist composition which exhibits excellent solubility in an organic solvent and is capable of forming a resist pattern having an excellent shape, and a method of forming a resist pattern.

BEST MODE FOR CARRYING OUT THE INVENTION

<<Positive Resist Composition>>

The resist composition of the present invention includes a resin component (A) (hereafter, frequently referred to as "component (A)") which exhibits increased solubility in an alkali developing solution under action of acid and an acid-generator component (B) which generates acid upon irradiation.

In the positive resist composition, the component (A) is alkali insoluble prior to exposure, and when acid is generated from the component (B) upon exposure, the generated acid acts on the component (A) to increase the alkali solubility thereof. Therefore, in the formation of a resist pattern, by conducting selective exposure of a resist film formed by applying the positive resist composition onto a substrate, the exposed portions become alkali soluble, whereas the unexposed portions remain alkali insoluble, and hence, a resist pattern can be formed by alkali developing.

<Component (A)>

In the present invention, the component (A) includes a structural unit (a0-1) represented by general formula (a0-1) above and a structural unit (a0-2) represented by general formula (a0-2) above.

Both of the structural unit (a0-1) and the structural unit (a0-2) are structural units derived from acrylate ester.

In the present descriptions and claims, the term "structural unit derived from an acrylate ester" refers to a structural unit which is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. With respect to the "structural unit derived from an acrylate ester", the "α-position (the carbon atom on the α-position)" refers to the carbon atom having the carbonyl group bonded thereto, unless specified otherwise.

As the substituent which may be bonded to the carbon atom on the α-position (substituent at the α-position), a halogen atom, a lower alkyl group or a halogenated lower alkyl group can be mentioned.

Examples of halogen atoms for the substituent at the α-position include fluorine atoms, chlorine atoms, bromine atoms and iodine atoms, and fluorine atoms are particularly desirable.

Examples of the lower alkyl group for the substituent at the α-position include linear or branched lower alkyl groups such as a methyl group, ethyl group, propyl group, isopropyl group, n-butyl group, isobutyl group, tert-butyl group, pentyl group, isopentyl group, and neopentyl group.

Examples of the halogenated lower alkyl group for the substituent at the α-position include groups in which a part or all of the hydrogen atoms of the aforementioned "lower alkyl group for the substituent at the α-position" are substituted with halogen atoms. Examples of halogen atoms include fluorine atoms, chlorine atoms, bromine atoms and iodine atoms, and fluorine atoms are particularly desirable.

In the present invention, it is preferable that a hydrogen atom, a halogen atom, a lower alkyl group or a halogenated lower alkyl group be bonded to the α-position of the acrylate ester, more preferably a hydrogen atom, a fluorine atom, a lower alkyl group or a fluorinated lower alkyl group. In terms of industrial availability, a hydrogen atom or a methyl group is particularly desirable.

[Structural Unit (a0-1)]

In general formula (a0-1), R represents a hydrogen atom, a halogen atom, a lower alkyl group or a halogenated lower alkyl group.

The halogen atom, lower alkyl group and halogenated lower alkyl group for R are the same as the halogen atom, lower alkyl group and halogenated lower alkyl group which may be bonded to the α-position of the aforementioned acrylate ester. As R, a hydrogen atom or a methyl group is preferable.

In general formula (a0-1), $Y^1$ represents an aliphatic cyclic group.

In the present description and claims, the term "aliphatic" is a relative concept used in relation to the term "aromatic", and defines a group or compound that has no aromaticity. The term "aliphatic cyclic group" refers to a mono cyclic group or polycyclic group that has no aromaticity.

The "aliphatic cyclic group" within the structural unit (a0-1) may or may not have a substituent. Examples of substituents include a lower alkyl group of 1 to 5 carbon atoms, a fluorine atom, a fluorinated lower alkyl group of 1 to 5 carbon atoms which is substituted with a fluorine atom, and an oxygen atom (=O).

The basic ring of the "aliphatic cyclic group" exclusive of substituents (aliphatic ring) is not limited to be constituted from only carbon and hydrogen (not limited to hydrocarbon rings), but is preferably a hydrocarbon ring. Further, the "hydrocarbon ring" may be either saturated or unsaturated, but is preferably saturated. The aliphatic cyclic group may be either a polycyclic group or a monocyclic group.

As such aliphatic cyclic groups, groups in which two or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be mentioned. Specific examples include groups in which two or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The aliphatic cyclic group within the structural unit (a0-1) is preferably a polycyclic group, and a group in which two or more hydrogen atoms have been removed from adamantane is particularly desirable.

In general formula (a0-1), Z represents a tertiary alkyl group-containing group or an alkoxyalkyl group.

In the present description and claims, the term "tertiary alkyl group" refers to an alkyl group having a tertiary carbon atom. As mentioned above, the term "alkyl group" refers to a monovalent saturated hydrocarbon group, and includes chain-like (linear or branched) alkyl groups and cyclic alkyl groups.

The term "tertiary alkyl group-containing group" refers to a group which includes a tertiary alkyl group in the structure thereof. The tertiary alkyl group-containing group may be either constituted of only a tertiary alkyl group, or constituted of a tertiary alkyl group and an atom or group other than a tertiary alkyl group.

As the "atom or group other than a tertiary alkyl group" which constitutes the tertiary alkyl group-containing group with a tertiary alkyl group, a carbonyloxy group, a carbonyl group, an alkylene group and an oxygen atom can be exemplified.

As the tertiary alkyl group-containing group for Z, a tertiary alkyl group-containing group which does not have a ring structure, and a tertiary alkyl group-containing group which has a ring structure can be exemplified.

A tertiary alkyl group-containing group which does not have a ring structure is a group which has a branched tertiary alkyl group as the tertiary alkyl group, and has no ring structure in the structure thereof.

As the branched tertiary alkyl group, for example, a group represented by general formula (I) shown below may be exemplified.

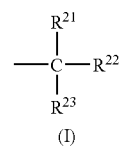

[Chemical Formula 2]

(I)

In general formula (I), each of $R^{21}$ to $R^{23}$ independently represents a linear or branched alkyl group. The alkyl group preferably has 1 to 5 carbon atoms, more preferably 1 to 3.

Further, in the group represented by general formula (I), the total number of carbon atoms is preferably 4 to 7, more preferably 4 to 6, most preferably 4 or 5.

Specific examples of groups represented by general formula (I) include a tert-butyl group and a tert-amyl group, and a tert-butyl group is preferable.

Examples of tertiary alkyl group-containing groups which do not have a ring structure include the aforementioned branched tertiary alkyl group; a tertiary alkyl group-containing, chain-like alkyl group in which the aforementioned branched tertiary alkyl group is bonded to a linear or branched alkylene group; a tertiary alkyloxycarbonyl group which has the aforementioned branched tertiary alkyl group as the tertiary alkyl group; and a tertiary alkyloxycarbonylalkyl group which has the aforementioned branched tertiary alkyl group as the tertiary alkyl group.

As the alkylene group within the tertiary alkyl group-containing, chain-like alkyl group, an alkylene group of 1 to 5 carbon atoms is preferable, more preferably 1 to 4 carbon atoms, and still more preferably 1 to 2 carbon atoms.

As a chain-Like tertiary alkyloxycarbonyl group, for example, a group represented by general formula (II) shown below can be mentioned. In general formula (II), $R^{21}$ to $R^{23}$ are as defined for $R^{21}$ to $R^{23}$ in general formula (I) above. As the chain-like tertiary alkyloxycarbonyl group, a tert-butyloxycarbonyl group (t-boc) or a tert-amyloxycarbonyl group are preferable.

As a chain-like tertiary alkyloxycarbonylalkyl group, for example, a group represented by general formula (III) shown below can be mentioned. In general formula (III), $R^{21}$ to $R^{23}$ are as defined for $R^{21}$ to $R^{23}$ in general formula (I) above. In general formula (III), f is an integer of 1 to 3, preferably 1 or 2. As the chain-like tertiary alkyloxycarbonylalkyl group, a tert-butyloxycarbonylmethyl group or a tert-butyloxycarbonylethyl group are preferable.

Among these, as the tertiary alkyl group-containing groups which do not have a ring structure, a tertiary alkyloxycarbonyl group or a tertiary alkyloxycarbonylalkyl group is preferable, more preferably a tertiary alkyloxycarbonyl group, and most preferably a tert-butyloxycarbonyl group.

[Chemical Formula 3]

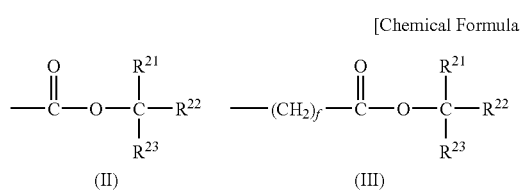

A tertiary alkyl group-containing group which has a ring structure is a group which contains a tertiary carbon atom and a ring structure in the structure thereof.

In the tertiary alkyl group-containing group which has a ring structure, the ring structure preferably has 4 to 12 carbon atoms which constitute the ring, more preferably 5 to 10 carbon atoms, and most preferably 6 to 10 carbon atoms. As the ring structure, for example, groups in which one or more hydrogen atoms have been removed from a monocycloalkane or a polycycloalkane such as a bicycloalkane, tricycloalkane or tetracycloalkane may be mentioned. Preferable examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the tertiary alkyl group-containing group which has a ring structure, for example, a group having the following group (1) or (2) as the tertiary alkyl group can be mentioned.

(1) A group in which a linear or branched alkyl group is bonded to a carbon atom which constitutes the ring of a cyclic alkyl group (cycloalkyl group), so that the carbon atom becomes a tertiary carbon atom.

(2) A group in which an alkylene group (branched alkylene group) having a tertiary carbon atom is bonded to a carbon atom constituting the ring of a cycloalkyl group.

In the aforementioned group (1), the linear or branched alkyl group preferably has 1 to 5 carbon atoms, more preferably 1 to 4, and most preferably 1 to 3.

Specific examples of the group (1) include a 2-methyl-2-adamantyl group, a 2-ethyl-2-adamantyl group, a 1-methyl-1-cycloalkyl group and 1-ethyl-1-cycloalkyl group.

In the aforementioned group (2), the cycloalkyl group having a branched alkylene group bonded thereto may have a substituent. Examples of such substituents include a fluorine atom, a fluorinated lower alkyl group of 1 to 5 carbon atoms which is substituted with a fluorine atom, and an oxygen atom (=O).

As a specific example of the group (2), a group represented by general formula (IV) shown below may be mentioned.

[Chemical Formula 4]

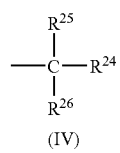

(IV)

In general formula (IV), $R^{24}$ represents a cycloalkyl group which may or may not have a substituent. Examples of the substituent which the cycloalkyl group may include a fluorine atom, a fluorinated alkyl group of 1 to 5 carbon atoms which is substituted by a fluorine atom, and an oxygen atom (=O).

Each of $R^{25}$ and $R^{26}$ independently represents a linear or branched alkyl group. As the alkyl group, the same as the linear or branched alkyl group for $R^{21}$ to $R^{23}$ in general formula (I) above may be mentioned.

As the alkoxyalkyl group for Z, for example, a group represented by general formula (V) may be mentioned.

In formula (V), $R^{41}$ represents a linear, branched or cyclic alkyl group.

When $R^{41}$ is a linear or branched alkyl group, it is preferably an alkyl group of 1 to 5 carbon atoms, more preferably an ethyl group or a methyl group, and an ethyl group is particularly desirable.

When $R^{41}$ is a cyclic alkyl group, it preferably has 4 to 15 carbon atoms, more preferably 4 to 12 carbon atoms, and most preferably 5 to 10 carbon atoms. Examples thereof include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated lower alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

$R^{42}$ represents a linear or branched alkylene group. The alkylene group preferably has 1 to 5 carbon atoms, more preferably 1 to 3 carbon atoms, and most preferably 1 or 2.

As the alkoxyalkyl group for Z, a group represented by general formula (VI) shown below is particularly desirable.

[Chemical Formula 5]

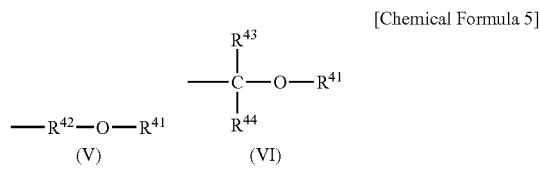

(V)   (VI)

In general formula (VI), $R^{41}$ is as defined for $R^{41}$ in general formula (V) above, and each of $R^{43}$ and $R^{44}$ independently represents a linear or branched alkyl group or a hydrogen atom.

With respect to $R^{43}$ and $R^{44}$, the alkyl group preferably has 1 to 15 carbon atoms, and may be either linear or branched. The alkyl group for $R^{43}$ and $R^{44}$ is preferably an ethyl group or a methyl group, and most preferably a methyl group. It is particularly desirable that either one of $R^{43}$ and $R^{44}$ be a hydrogen atom, and the other be a methyl group.

Among the above-mentioned examples, as Z, a tertiary alkyl group-containing group is preferable, more preferably a group represented by general formula (II) above, and most preferably a tert-butyloxycarbonyl group (t-boc).

In general formula (a0-1), a represents an integer of 1 to 3, and b represents an integer of 0 to 2, with the proviso that a+b=1 to 3.

a is preferably 1.

b is preferably 0.

a+b is preferably 1.

c represents an integer of 0 to 3, preferably 0 or 1, and more preferably 0.

d represents an integer of 0 to 3, preferably 0 or 1, and more preferably 0.

e represents an integer of 0 to 3, preferably 0 or 1, and more preferably 0.

As the structural unit (a0-1), a structural unit represented by general formula (a0-1-1) shown below is particularly desirable.

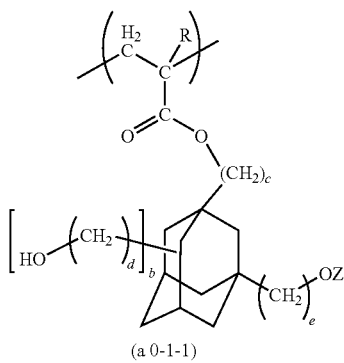

[Chemcial Formula 6]

(a 0-1-1)

wherein R, Z, b, c, d and e are respectively as defined for R, Z, b, c, d and e in general formula (a0-1) above.

A monomer for deriving the structural unit (a0-1) can be synthesized, for example, by protecting a part or all of the hydroxyl groups within a compound represented by general formula (a0-1') shown below (an acrylate ester containing an aliphatic cyclic group having 1 to 3 alcoholic hydroxyl groups) with tertiary alkyl group-containing groups or alkoxyalkyl groups by a conventional method.

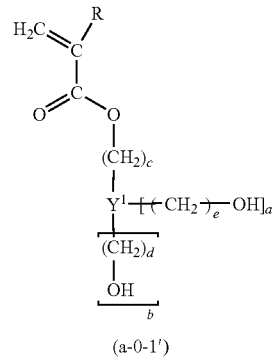

[Chemical Formula 7]

(a-0-1')

wherein R, $Y^1$, a, b, c, d and e are respectively as defined for R, $Y^1$, a, b, c, d and e in general formula (a0-1) above.

As the structural unit (a0-1), one type of structural unit may be used alone, or two or more types of structural units may be used in combination.

The amount of the structural unit (a0-1) within the component (A) based on the combined total of all structural units constituting the component (A) is preferably 1 to 40 mol %, more preferably 1 to 25 mol %, and still more preferably 5 to 20 mol %. By making the amount of the structural unit (a0-1) at least as large as 1 mol %, the solubility of the component (A) in an organic solvent is improved. On the other hand, by making the amount of the structural unit (a0-1) no more than 40 mol %, a good balance can be achieved with the other structural units.

[Structural Unit (a0-2)]

As R in general formula (a0-2) above, the same as R in general formula (a0-1) above can be mentioned.

As the aliphatic cyclic group for $Y^3$, the same as the aliphatic cyclic group for $Y^1$ in general formula (a0-1) above can be mentioned. As $Y^3$, it is preferable that the basic ring (aliphatic ring) has the same structure as $Y^1$.

g represents an integer of 0 to 3, preferably 0 or 1, and more preferably 0.

h represents an integer of 0 to 3, preferably 0 or 1, and more preferably 0.

i represents an integer of 1 to 3, and preferably 1.

As the structural unit (a0-2), a structural unit represented by general formula (a0-2-1) shown below is preferable, and a structural unit in which one of the i groups of —$(CH_2)_h$—OH is bonded to the 3rd position of the 1-adamantyl group is particularly desirable.

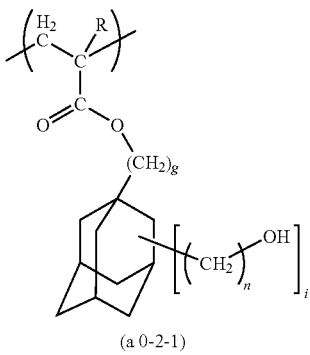

[Chemical Formula 8]

(a0-2-1)

wherein R, g, h, and i are respectively as defined for R, g, h, and i in general formula (a0-2) above.

As the structural unit (a0-2), one type of structural unit may be used alone, or two or more types of structural units may be used in combination.

The amount of the structural unit (a0-2) within the component (A) based on the combined total of all structural units constituting the component (A) is preferably 1 to 30 mol %, more preferably 5 to 25 mol %, and still more preferably 10 to 20 mol %. By making the amount of the structural unit (a0-2) at least as large as 1 mol %, the rectangularity of the cross-sectional shape of the resist pattern is improved, and hence, a resist pattern having an excellent shape can be formed. On the other hand, by making the amount of the structural unit (a0-2) no more than 30 mol %, a good balance can be achieved with the other structural units.

[Structural Unit (a1)]

The component (A) preferably has a structural unit (a1) derived from an acrylate ester having an acid dissociable, dissolution inhibiting group, as well as the structural unit (a0-1) and the structural unit (a0-2).

As the acid dissociable, dissolution inhibiting group in the structural unit (a1), any of the groups that have been proposed as acid dissociable, dissolution inhibiting groups for the base resins of chemically amplified resists can be used, provided the group has an alkali dissolution-inhibiting effect that renders the entire component (A) alkali insoluble prior to dissociation, and then following dissociation, renders the entire component (A) alkali soluble.

Generally, groups that form either a cyclic or chain-like tertiary alkyl ester with the carboxyl group of the (meth) acrylic acid, and acetal-type acid dissociable, dissolution inhibiting groups such as alkoxyalkyl groups are widely known.

The term "(meth)acrylic acid" is a generic term that includes either or both of acrylic acid having a hydrogen atom bonded to the α-position and methacrylic acid having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity.

The "aliphatic branched, acid dissociable, dissolution inhibiting group" is not limited to be constituted of only carbon and hydrogen (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, tert-amyl group and tert-heptyl group.

In the "aliphatic cyclic group-containing acid dissociable, dissolution inhibiting group", the "aliphatic cyclic group" may or may not have a substituent. Examples of substituents include a lower alkyl group of 1 to 5 carbon atoms, a fluorine atom, fluorinated lower alkyl groups of 1 to 5 carbon atoms which is substituted with a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated lower alkyl group, may be exemplified. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include a 2-methyl-2-adamantyl group and a 2-ethyl-2-adamantyl group. Further, groups having an aliphatic cyclic group such as an adamantyl group, and a branched alkylene group having a tertiary carbon atom bonded thereto, as in the group bonded to the oxygen atom of the carbonyloxy group (—C(O)—O—) in the structural units represented by general formula (a1") shown below, can be exemplified.

[Chemical Formula 9]

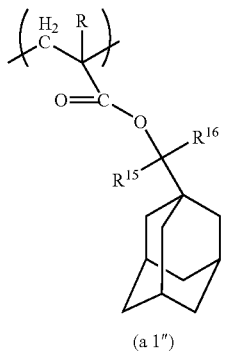

(a1″)

wherein R is as defined for R in general formula (a0-1) above, and each of $R^{15}$ and $R^{16}$ represents an alkyl group (which may be either linear or branched, and preferably has 1 to 5 carbon atoms).

An "acetal-type acid dissociable, dissolution inhibiting group" generally substitutes a hydrogen atom at the terminal of an alkali-soluble group such as a carboxy group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 10]

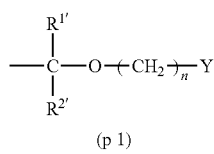

(p1)

wherein $R^{1\prime}$ and $R^{2\prime}$ each independently represents a hydrogen atom or a lower alkyl group; n represents an integer of 0 to 3; and Y represents a lower alkyl group or an aliphatic cyclic group.

In general formula (p1) above, n is preferably an integer of 0 to 2, more preferably 0 or 1, and most preferably 0.

As the lower alkyl group for $R^{1\prime}$ and $R^{2\prime}$, the same as the lower alkyl groups for R above can be mentioned. As the lower alkyl group for $R^{1\prime}$ and $R^{2\prime}$, a methyl group or ethyl group is preferable, and a methyl group is particularly desirable.

In the present invention, it is preferable that at least one of $R^{1\prime}$ and $R^{2\prime}$ be a hydrogen atom. That is, it is preferable that the acid dissociable, dissolution inhibiting group (p1) is a group represented by general formula (p1-1) shown below.

[Chemical Formula 11]

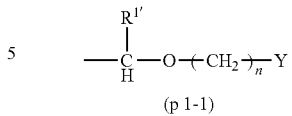

(p1-1)

wherein $R^{1\prime}$, n and Y are respectively as defined for $R^{1\prime}$, n and Y in general formula (p1) above.

As the lower alkyl group for Y, the same as the lower alkyl groups for R above can be mentioned.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be mentioned.

Further, as the acetal-type, acid dissociable, dissolution inhibiting group, groups represented by general formula (p2) shown below can also be exemplified.

[Chemical Formula 12]

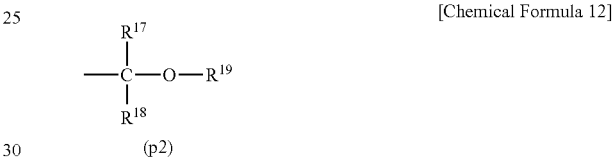

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be exemplified. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (p2) above, $R^{17}$ and $R^{19}$ may each independently represent a linear or branched alkylene group preferably an alkylene group of 1 to 5 carbon atoms), and the terminal of $R^{19}$ may be bonded to the terminal of $R^{17}$ In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include a tetrahydropyranyl group and a tetrahydrofuranyl group.

As the structural unit (a1), it is preferable to use at least one member selected from the group consisting of structural units represented by formula (a1-0-1) shown below and structural units represented by formula (a1-0-2) shown below.

[Chemical Formula 13]

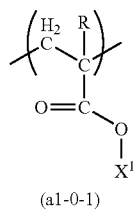

(a1-0-1)

wherein R represents a hydrogen atom, a halogen atom, a lower alkyl group or a halogenated lower alkyl group; and $X^1$ represents an acid dissociable, dissolution inhibiting group.

[Chemical Formula 14]

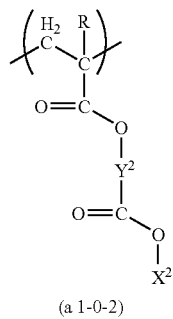

(a1-0-2)

wherein R represents a hydrogen atom, a halogen atom, a lower alkyl group or a halogenated lower alkyl group; $X^2$ represents an acid dissociable, dissolution inhibiting group; and $Y^2$ represents an alkylene group or an aliphatic cyclic group.

In general formula (a1-0-1) shown above, as the halogen atom, lower alkyl group and halogenated lower alkyl group for R, the same as the halogen atom, lower alkyl group and halogenated lower alkyl group for R in general formula (a0-1) above can be mentioned.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is as defined for R in general formula (a1-0-1) above.

$X^2$ is the same as $X^1$ in general formula (a1-0-1).

$Y^2$ represents an alkylene group or an aliphatic cyclic group, and is preferably an alkylene group of 1 to 4 carbon atoms or a divalent aliphatic cyclic group. As the aliphatic cyclic group, the same as those exemplified above in connection with the explanation of "aliphatic cyclic group" can be used, except that two or more hydrogen atoms have been removed therefrom.

Specific examples of the structural unit (a1) include structural units represented by general formulas (a1-1) to (a1-4) shown below.

[Chemical Formula 15]

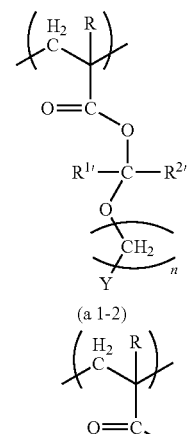

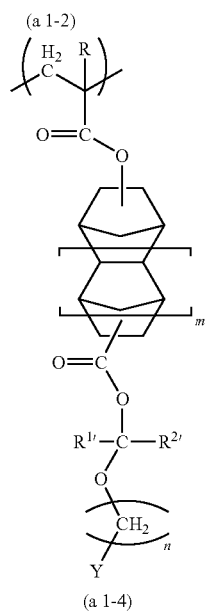

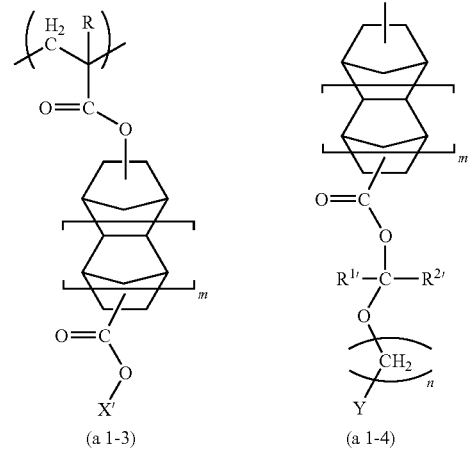

(a1-3)  (a1-4)

wherein X' represents a tertiary alkyl ester-type acid dissociable, dissolution inhibiting group; Y represents a lower alkyl group of 1 to 5 carbon atoms or an aliphatic cyclic group; n represents an integer of 0 to 3; m represents 0 or 1; R represents a hydrogen atom, a halogen atom, a lower alkyl group or a halogenated lower alkyl group; and each of $R^{1'}$ and $R^{2'}$ independently represents a hydrogen atom or a lower alkyl group of 1 to 5 carbon atoms.

In general formulas (a1-1) to (a1-4), the halogen atom, lower alkyl group and halogenated lower alkyl group for R are the same as the halogen atom, lower alkyl group and halogenated lower alkyl group which can be bonded to the α-position of the aforementioned acrylate ester.

It is preferable that at least one of $R^{1'}$ and $R^{2'}$ represent a hydrogen atom, and it is more preferable that both of $R^{1'}$ and $R^{2'}$ represent a hydrogen atom. n is preferably 0 or 1.

Examples of the tertiary alkyl ester-type acid dissociable, dissolution inhibiting group for X' are the same as the above-exemplified tertiary alkyl ester-type acid dissociable, dissolution inhibiting groups for $X^1$.

Examples of the aliphatic cyclic group for Y are the same as those exemplified above in connection with the explanation of "aliphatic cyclic group" in structural unit (a0-1).

Specific examples of structural units represented by general formulas (a1-1) to (a1-4) above are shown below.

[Chemical Formula 16]

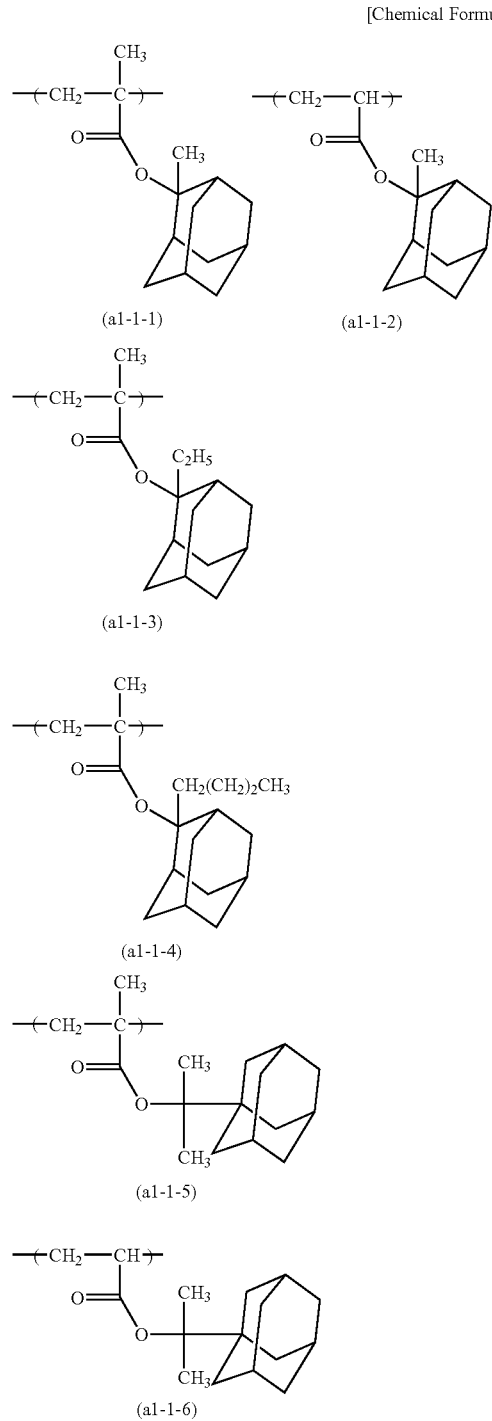
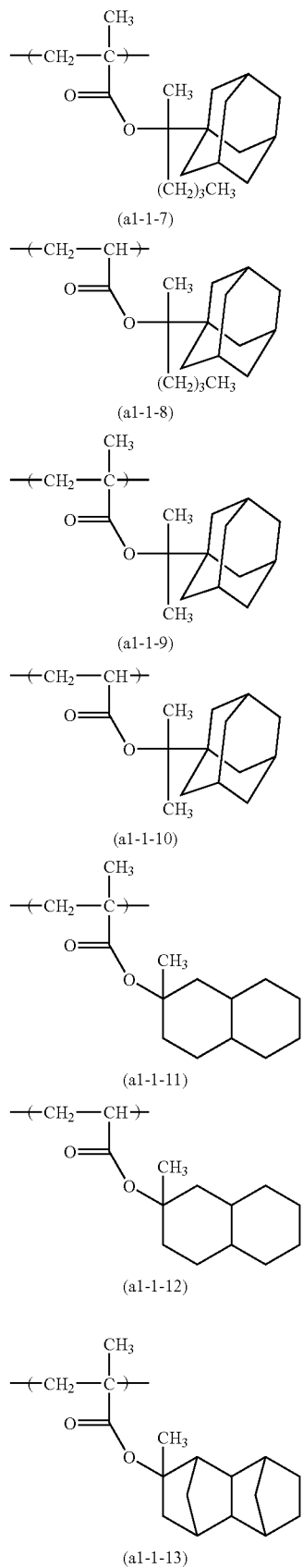

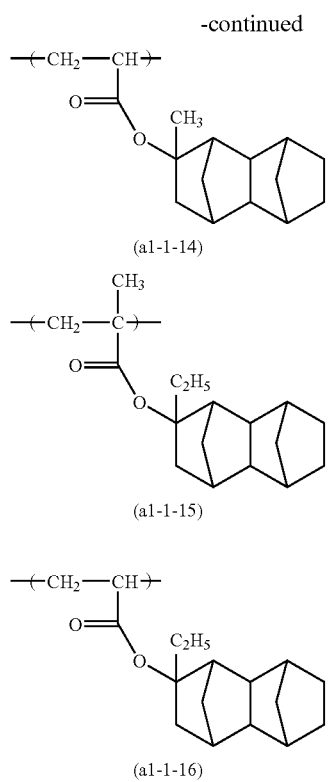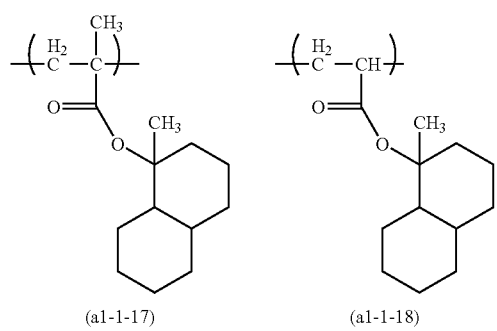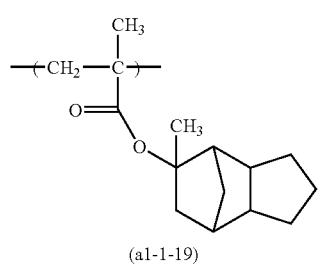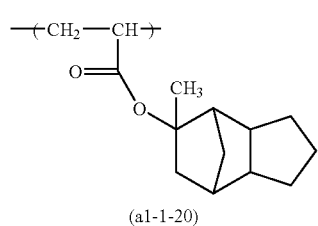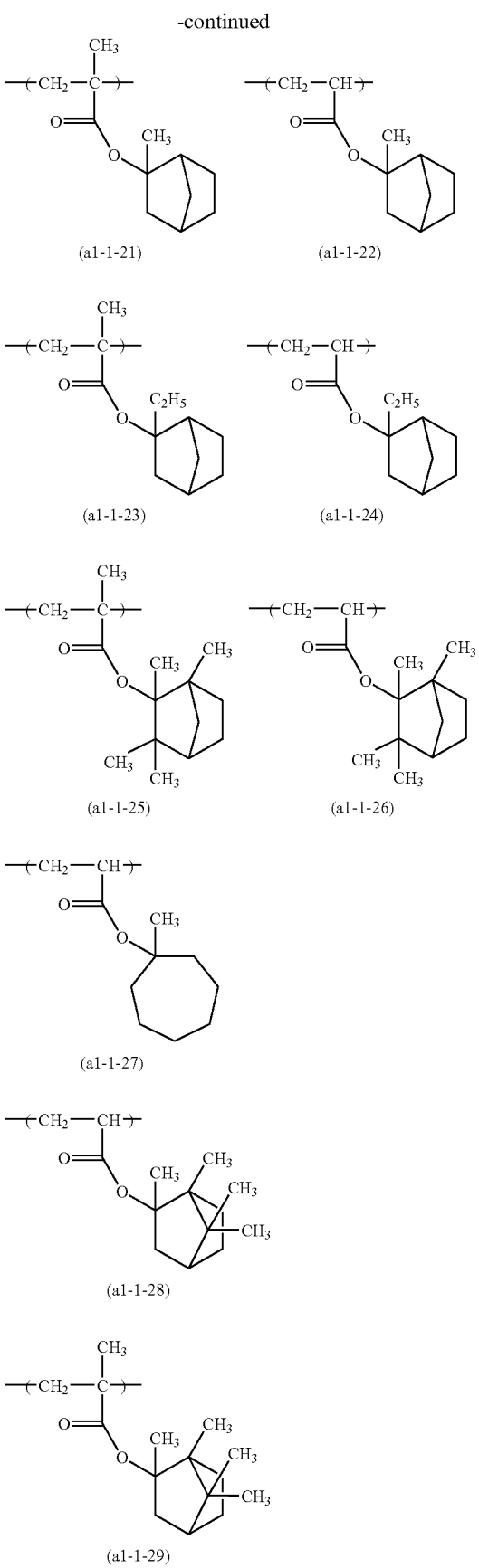

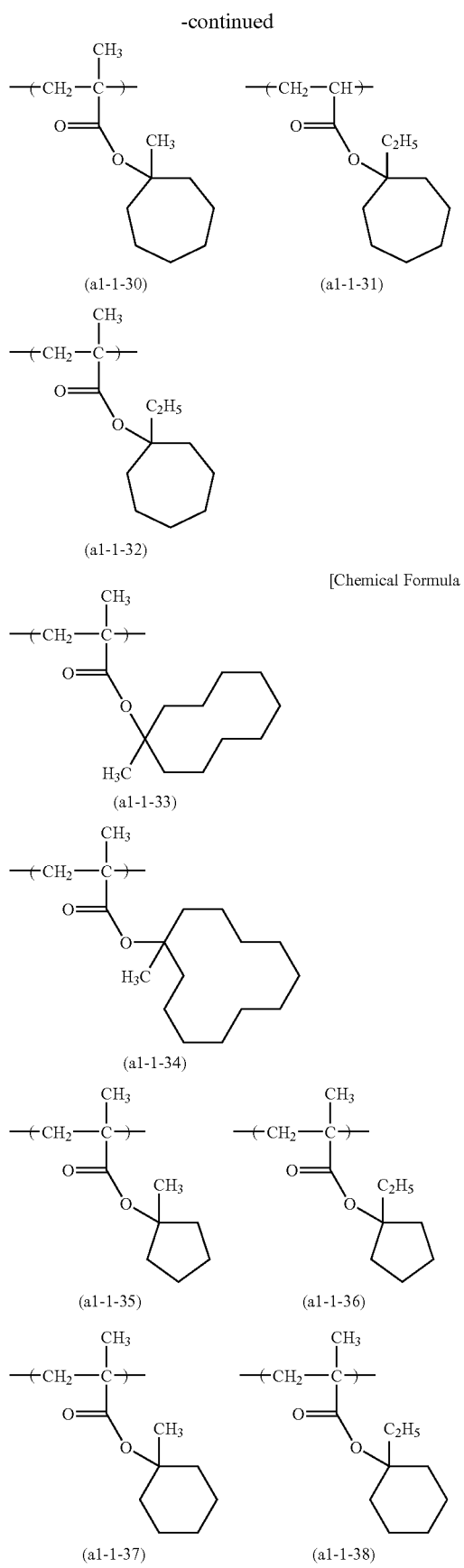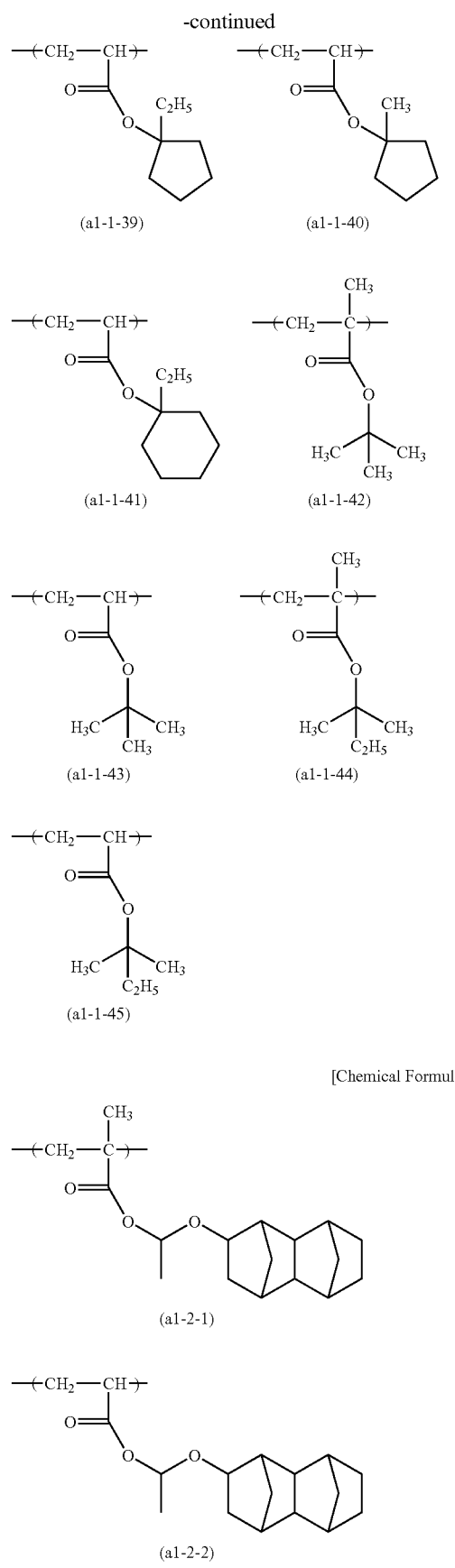

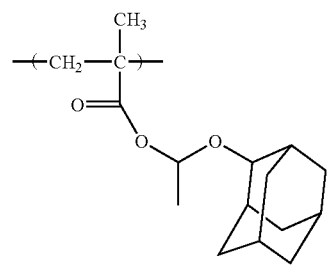
(a1-2-3)
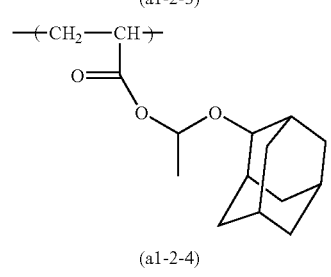
(a1-2-4)
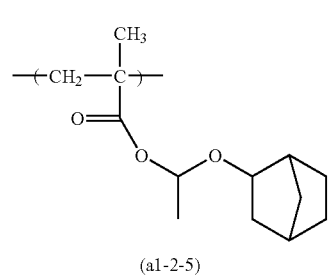
(a1-2-5)
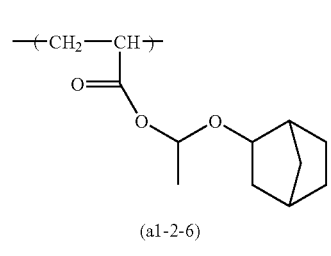
(a1-2-6)
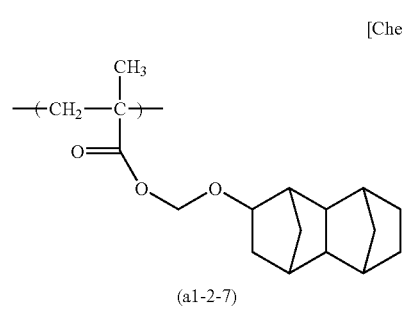
(a1-2-7)
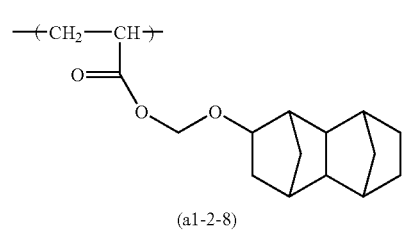
(a1-2-8)
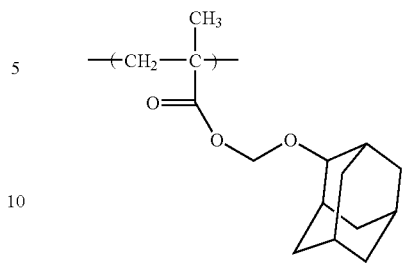
(a1-2-9)
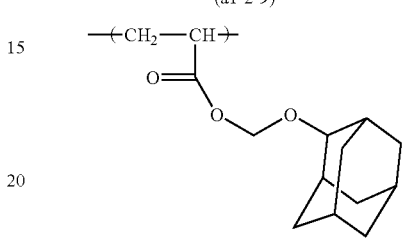
(a1-2-10)
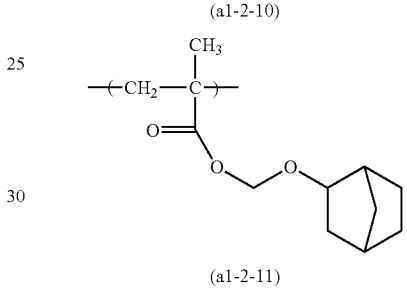
(a1-2-11)
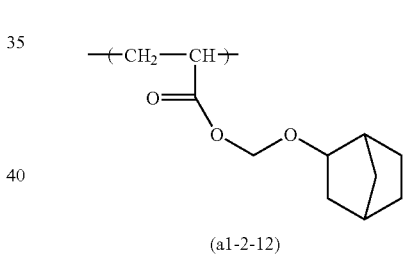
(a1-2-12)
[Chemical Formula 20]
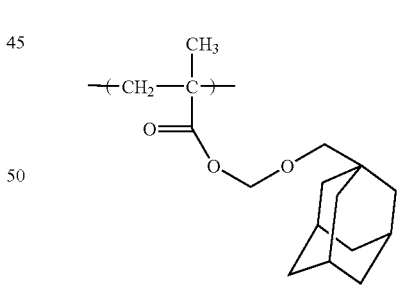
(a1-2-13)
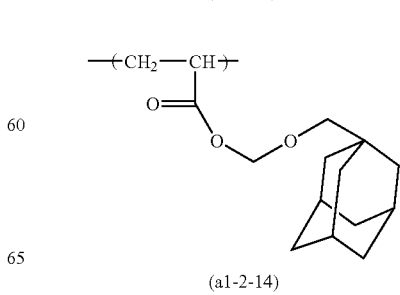
(a1-2-14)

-continued
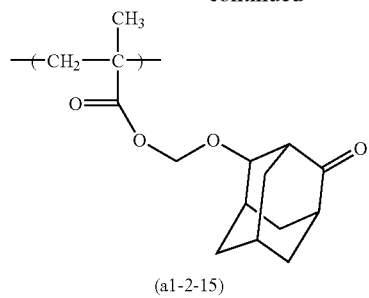
(a1-2-15)
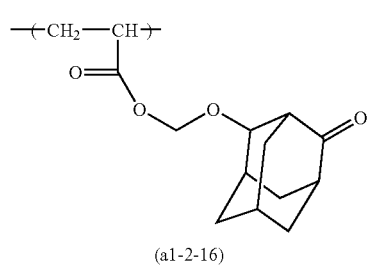
(a1-2-16)
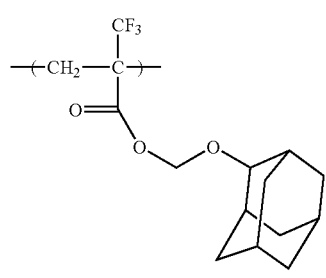
(a1-2-17)
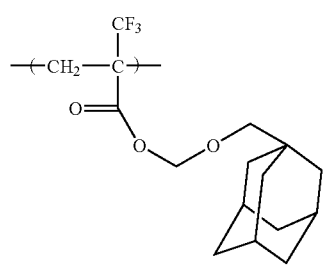
(a1-2-18)
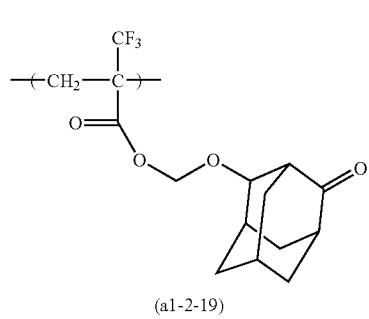
(a1-2-19)
-continued
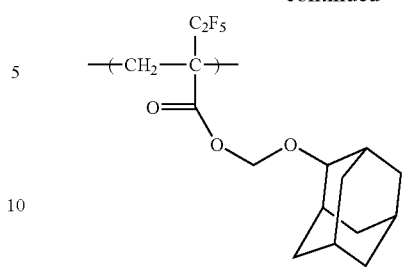
(a1-2-20)
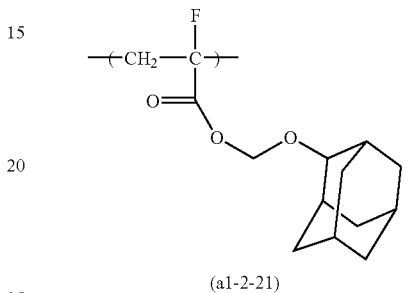
(a1-2-21)
[Chemical Formula 21]
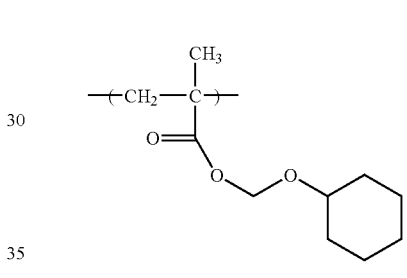
(a1-2-22)
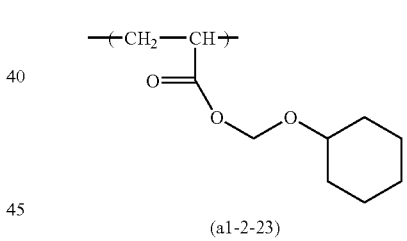
(a1-2-23)
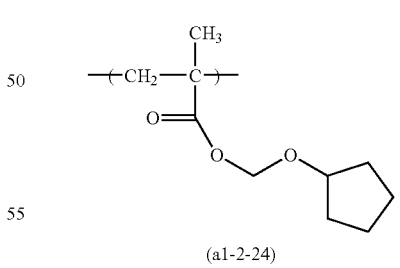
(a1-2-24)
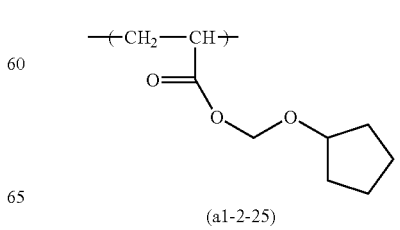
(a1-2-25)

-continued
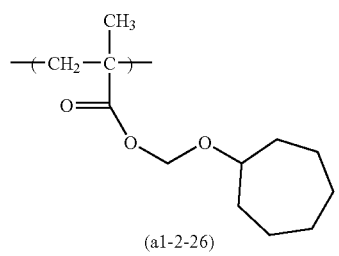
(a1-2-26)
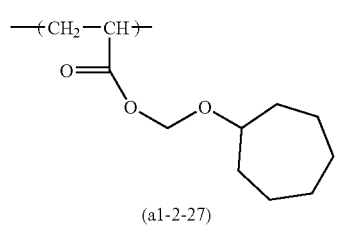
(a1-2-27)
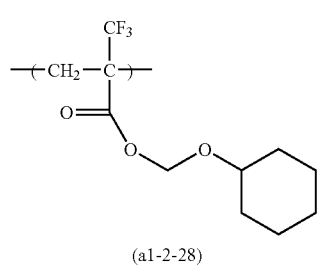
(a1-2-28)
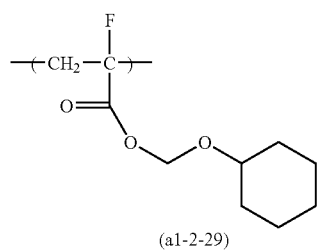
(a1-2-29)
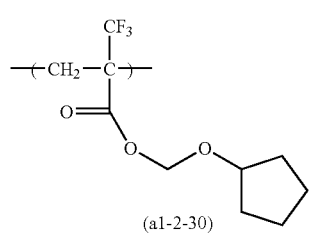
(a1-2-30)
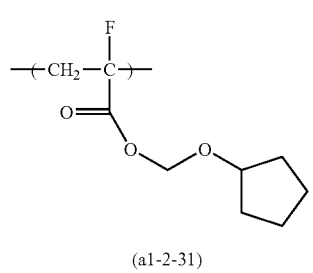
(a1-2-31)
-continued
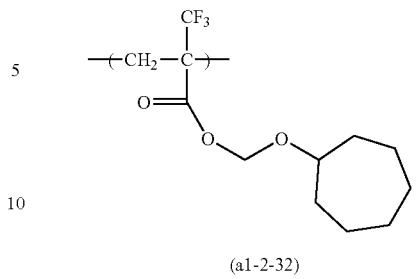
(a1-2-32)
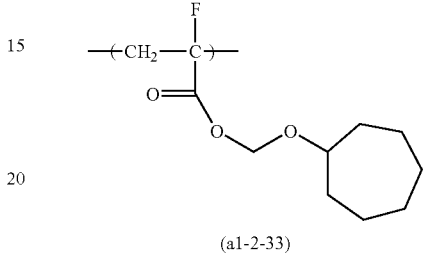
(a1-2-33)
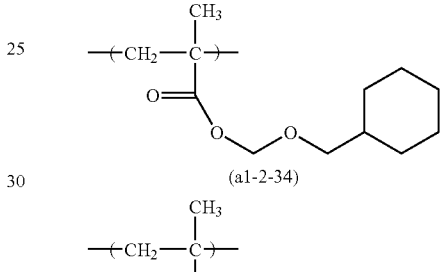
(a1-2-34)
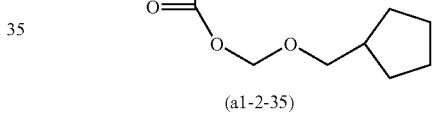
(a1-2-35)
[Chemical Formula 22]
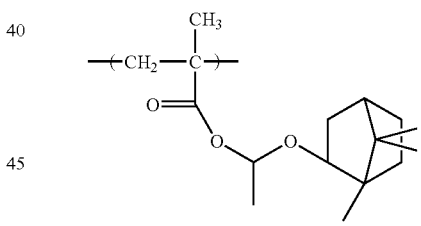
(a1-2-36)
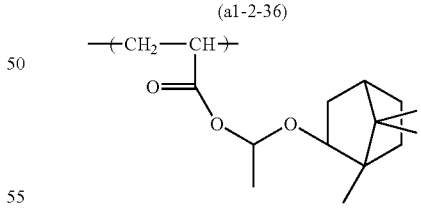
(a1-2-37)
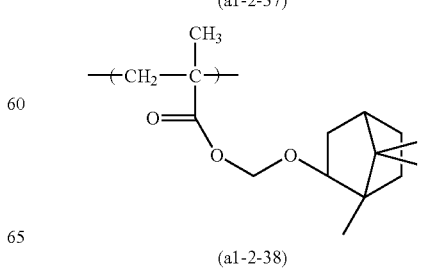
(a1-2-38)

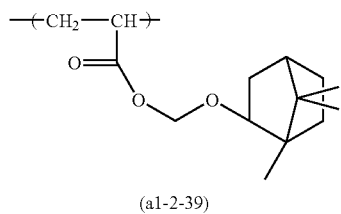
(a1-2-39)
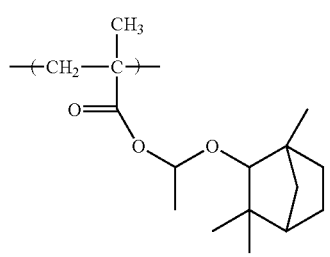
(a1-2-40)
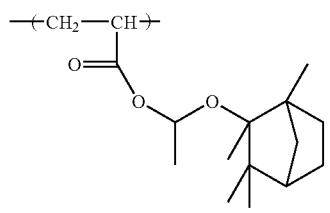
(a1-2-41)
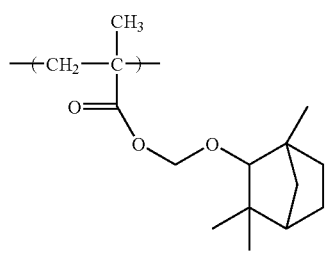
(a1-2-42)
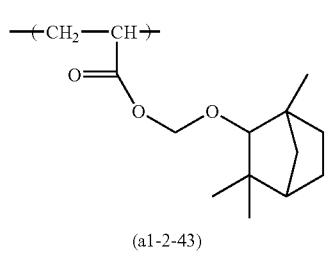
(a1-2-43)
[Chemical Formula 23]
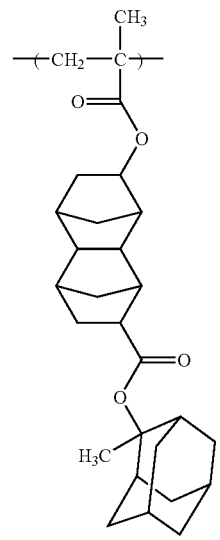
(a1-3-1)
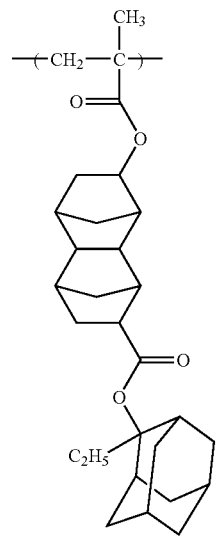
(a1-3-2)
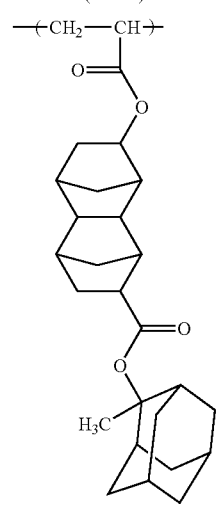
(a1-3-3)
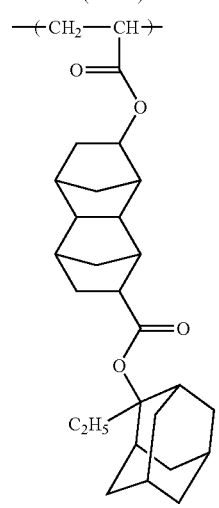
(a1-3-4)
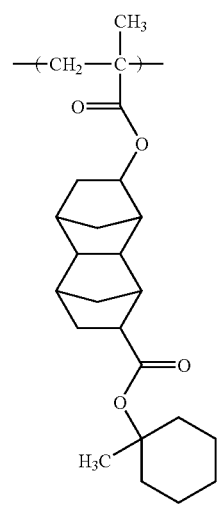
(a1-3-5)
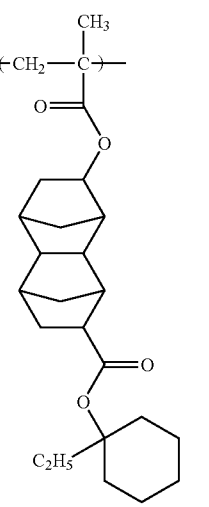
(a1-3-6)

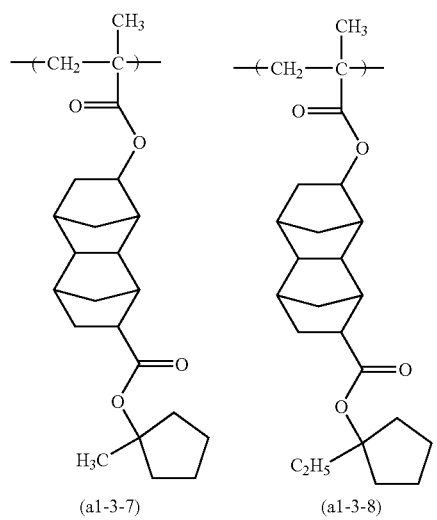
(a1-3-7)   (a1-3-8)
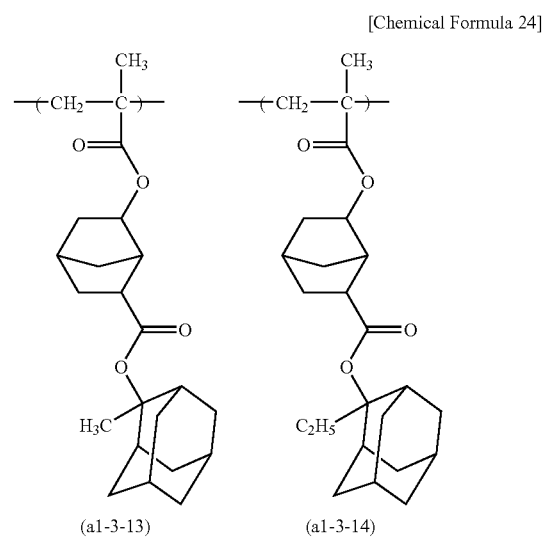
[Chemical Formula 24]
(a1-3-13)   (a1-3-14)
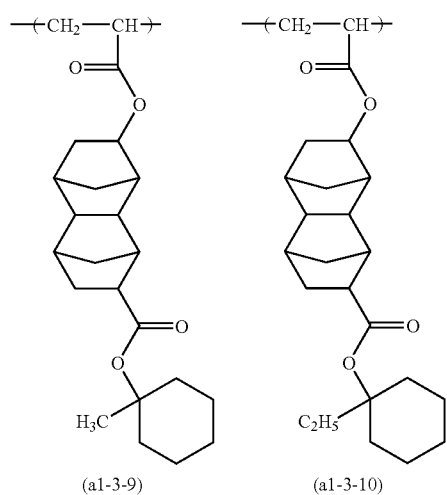
(a1-3-9)   (a1-3-10)
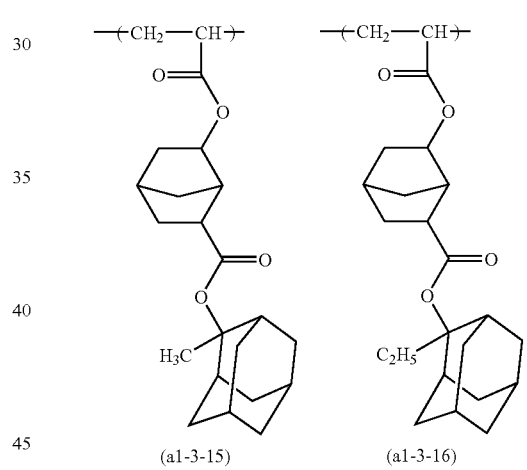
(a1-3-15)   (a1-3-16)
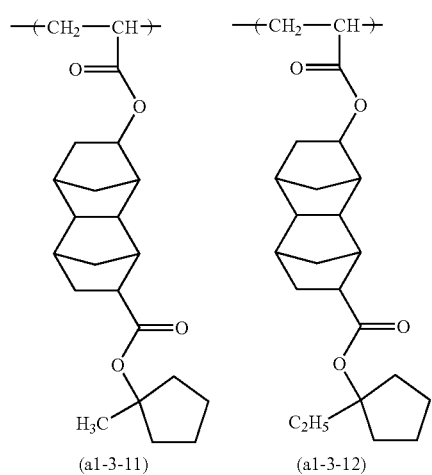
(a1-3-11)   (a1-3-12)
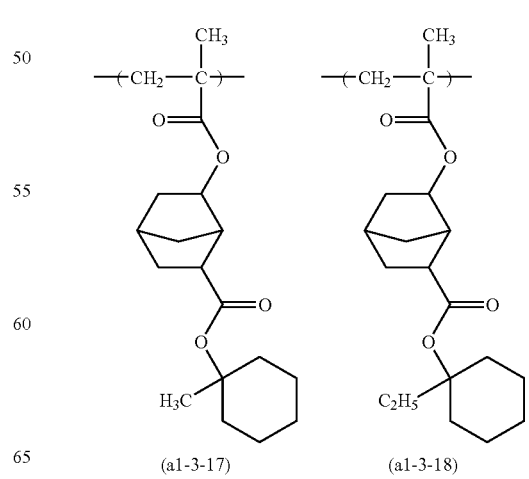
(a1-3-17)   (a1-3-18)

-continued
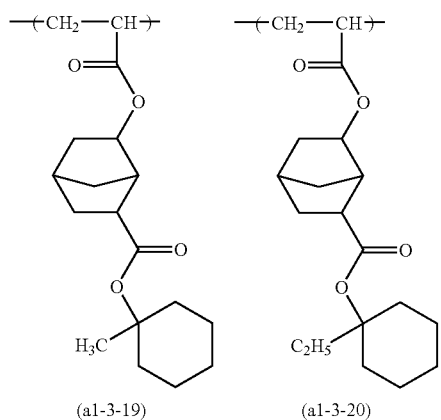
(a1-3-19)     (a1-3-20)
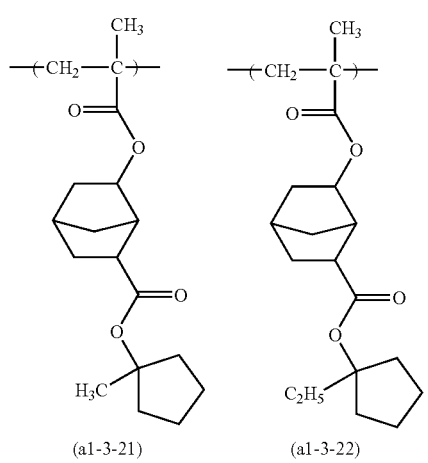
(a1-3-21)     (a1-3-22)
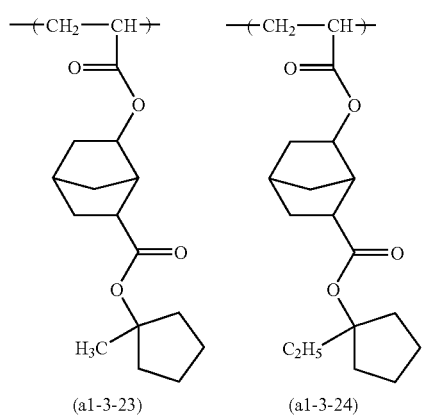
(a1-3-23)     (a1-3-24)
-continued
[Chemical Formula 25]
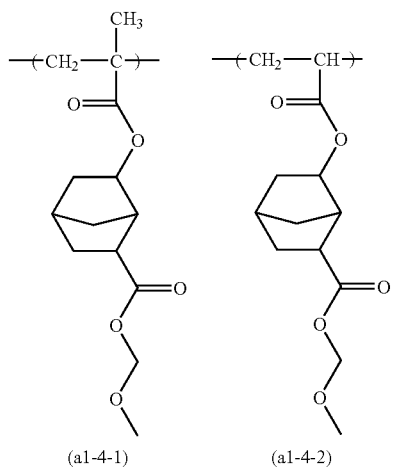
(a1-4-1)     (a1-4-2)
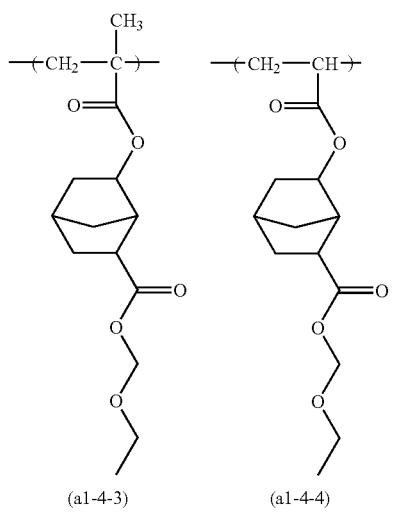
(a1-4-3)     (a1-4-4)
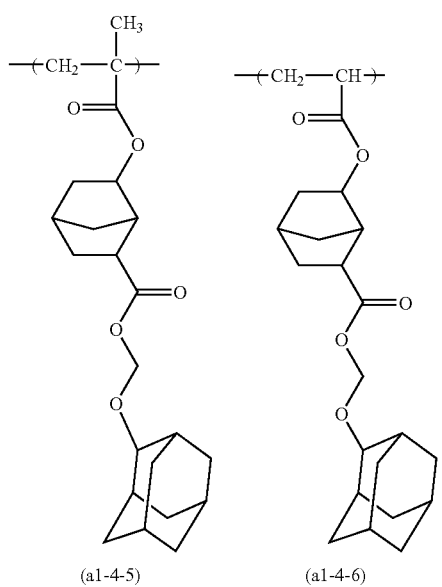
(a1-4-5)     (a1-4-6)

-continued
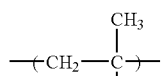
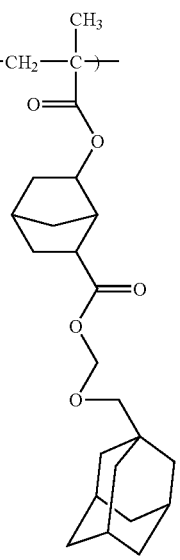
(a1-4-7)
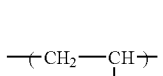
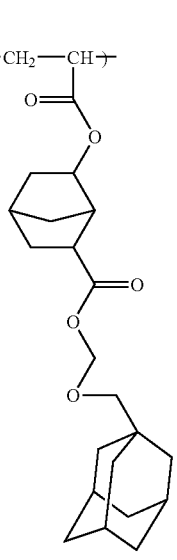
(a1-4-8)
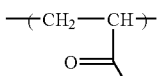
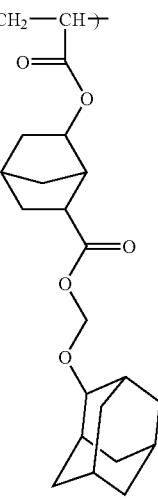
(a1-4-13)
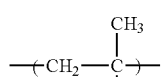
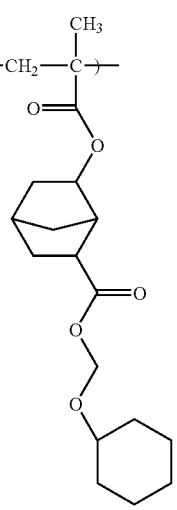
(a1-4-9)
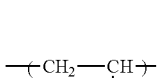
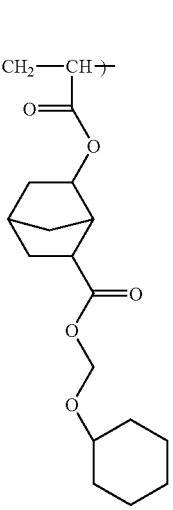
(a1-4-10)
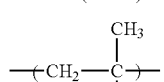
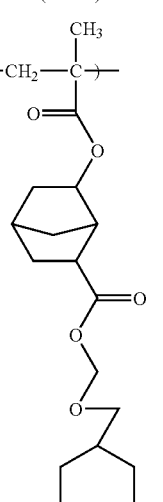
(a1-4-11)
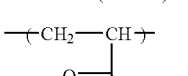
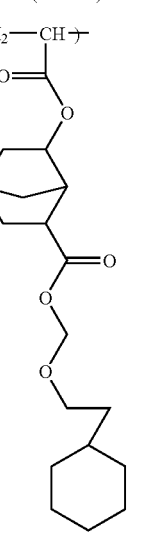
(a1-4-12)
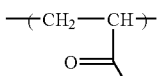
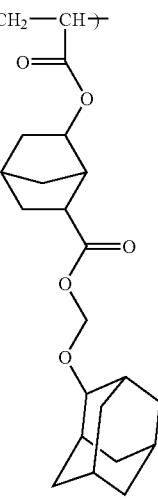
(a1-4-14)
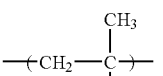
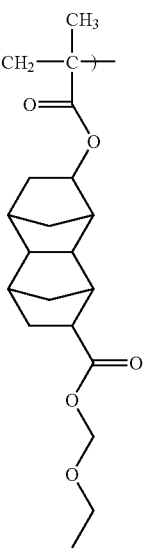
(a1-4-15)

[Chemical Formula 26]
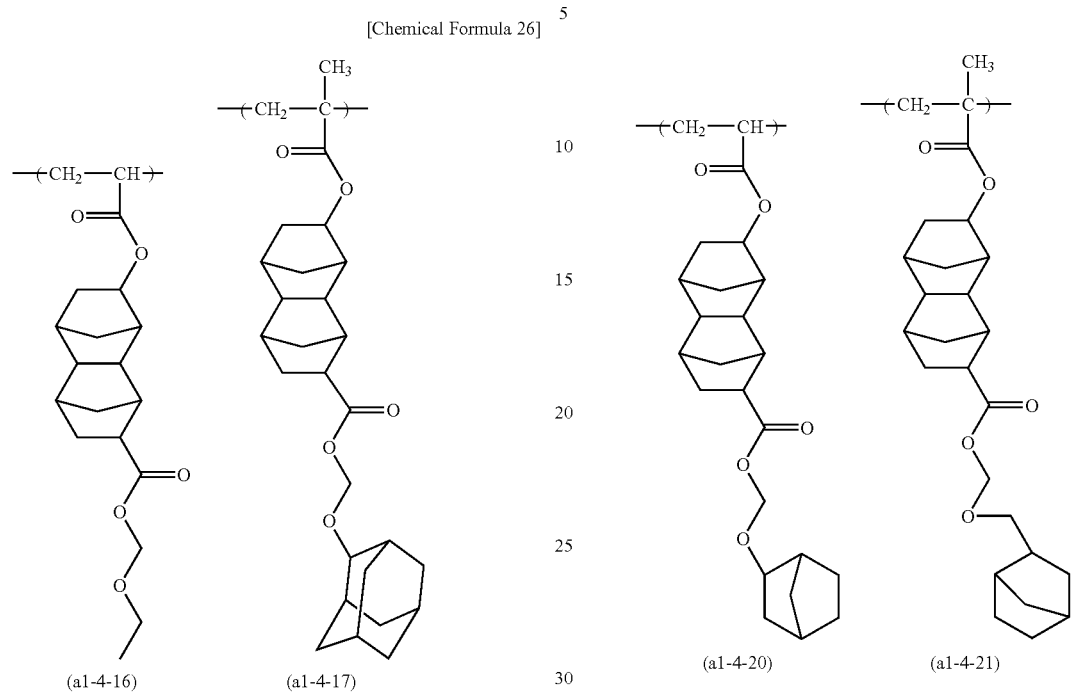
(a1-4-16)  (a1-4-17)  (a1-4-20)  (a1-4-21)
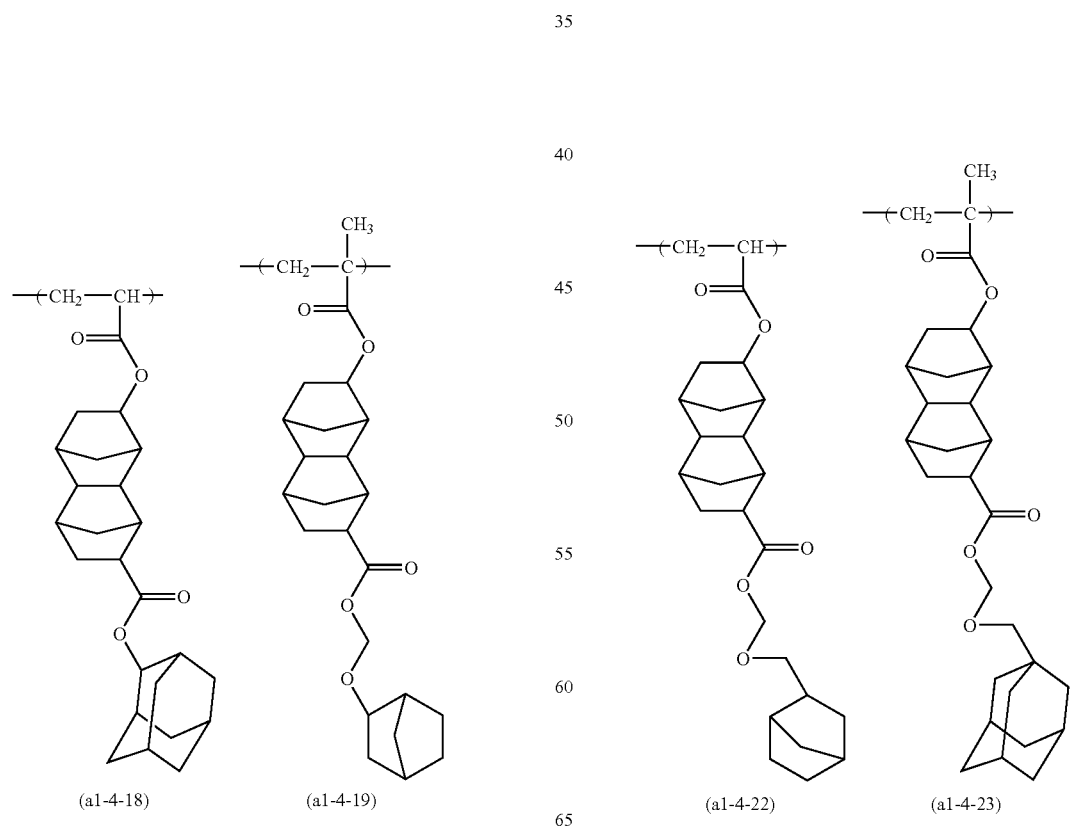
(a1-4-18)  (a1-4-19)  (a1-4-22)  (a1-4-23)

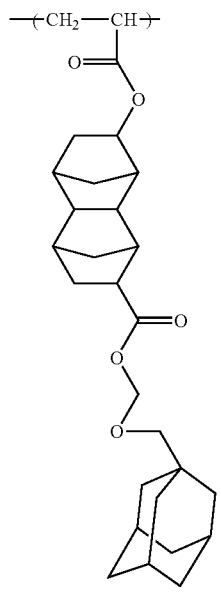 (a1-4-24)
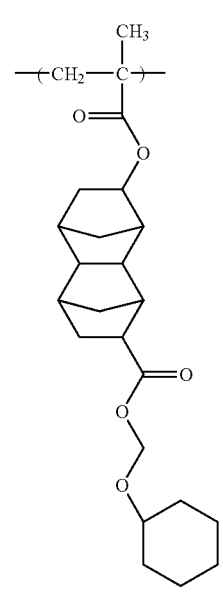 (a1-4-25)
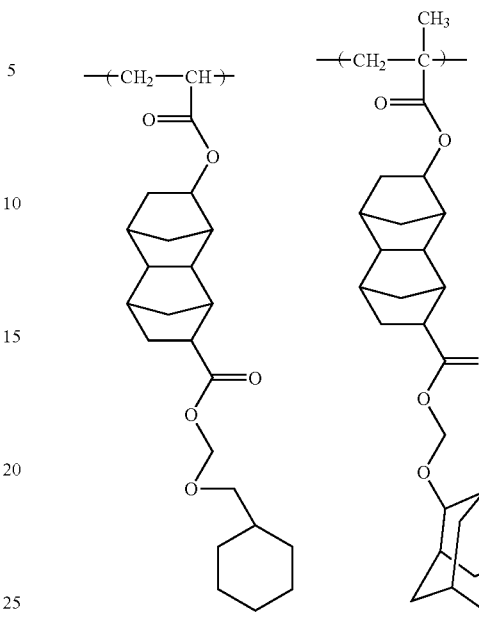 (a1-4-28) (a1-4-29)
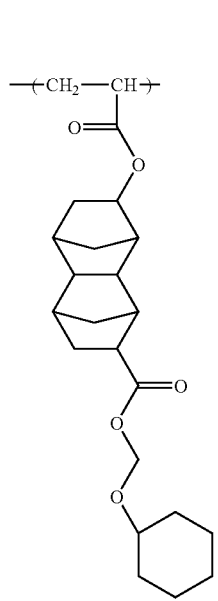 (a1-4-26)
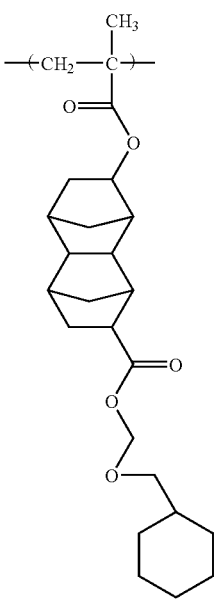 (a1-4-27)
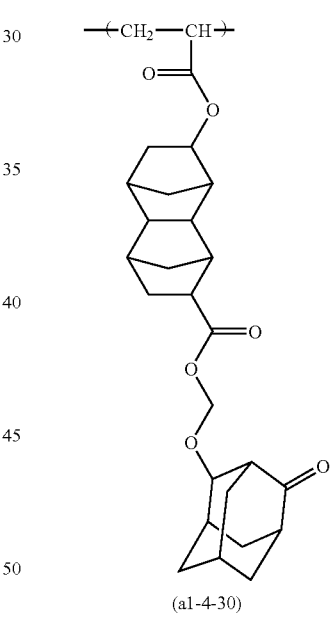 (a1-4-30)

Among these, structural units represented by general formula (a1-1) are preferable. More specifically, at least one structural unit selected from the group consisting of structural units represented by formulas (a1-1-1) to (a-1-1-6) and (a1-1-35) to (a1-1-41) is more preferable.

Further, as the structural unit (a1), structural units represented by general formula (a1-1-01) shown below which includes the structural units represented by formulas (a1-1-1) to (a1-1-4), and structural units represented by general formula (a1-1-02) shown below which includes the structural units represented by formulas (a1-1-35) to (a1-1-41) are also preferable.

[Chemical Formula 27]

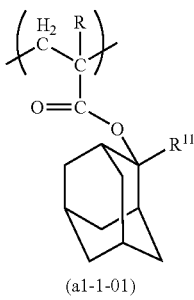

(a1-1-01)

wherein R represents a hydrogen atom, a halogen atom, a lower alkyl group or a halogenated lower alkyl group; and $R^{11}$ represents a lower alkyl group.

[Chemical Formula 28]

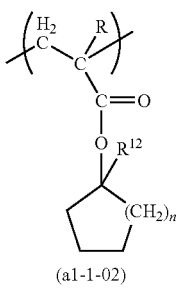

(a1-1-02)

wherein R represents a hydrogen atom, a halogen atom, a lower alkyl group or a halogenated lower alkyl group; $R^{12}$ represents a lower alkyl group; and h represents an integer of 1 to 3.

In general formula (a1-1-01), R is as defined for R in general formula (a0-1) above. The lower alkyl group for $R^{11}$ is the same as the lower alkyl group for R above, and is preferably a methyl group or an ethyl group.

In general formula (a1-1-02), R is as defined for R in general formula (a0-1) above. The lower alkyl group for $R^{12}$ is the same as the lower alkyl group for R above. $R^{12}$ is preferably a methyl group or an ethyl group, and most preferably an ethyl group. h is preferably 1 or 2, and most preferably 2.

As the structural unit (a1), one type of structural unit may be used alone, or two or more types of structural units may be used in combination.

In the component (A), the amount of the structural unit (a1) based on the combined total of all structural units constituting the component (A) is preferably 10 to 80 mol %, more preferably 20 to 70 mol %, and still more preferably 25 to 50 mol %. By making the amount of the structural unit (a1) at least as large as 10 mol %, a pattern can be easily formed using a resist composition prepared from the component (A). On the other hand, by making the amount of the structural unit (a1) no more than 80 mol %, a good balance can be achieved with the other structural units.

When the structural unit (a0-1) has an acid dissociable, dissolution inhibiting group, the structural unit (a0-1) may be regarded as a structural unit (a1). However, in the present invention, such a structural unit is included in the structural unit (a0-1), but not included in the structural unit (a1). That is, the structural unit represented by general formula (a0-1) above is not included in the structural unit (a1).

[Structural Unit (a2)]

The component (A) preferably has a structural unit (a2) derived from an acrylate ester having a lactone-containing cyclic group, as well as the structural unit (a0-1) and the structural unit (a0-2), or the structural unit (a0-1), the structural unit (a0-2) and the structural unit (a1).

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A) is used for forming a resist film, the lactone-containing cyclic group of the structural unit (a2) is effective in improving the adhesion between the resist film and the substrate, and increasing the hydrophilicity with the developing solution.

As the structural unit (a2), there is no particular limitation, and an arbitrary structural unit may be used.

Specific examples of lactone-containing monocyclic groups include groups in which one hydrogen atom has been removed from γ-butyrolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 29]

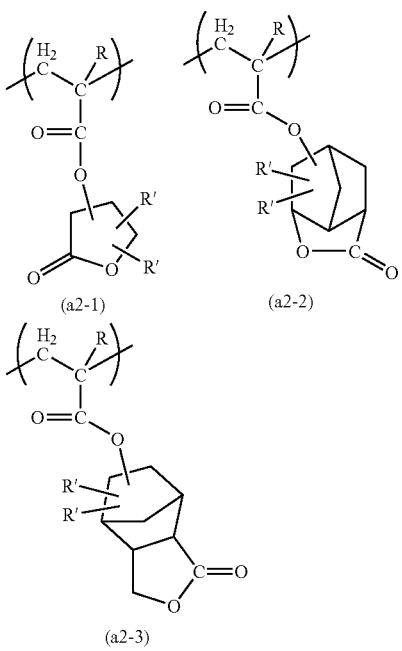

-continued

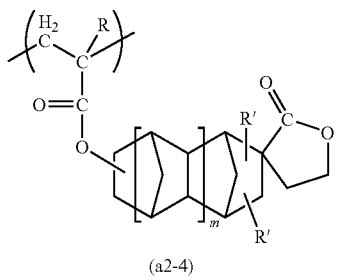
(a2-4)

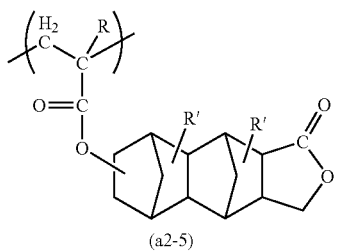
(a2-5)

wherein R represents a hydrogen atom, a halogen atom, a lower alkyl group or a halogenated lower alkyl group; R' represents a hydrogen atom, a lower alkyl group or an alkoxy group of 1 to 5 carbon atoms; and m represents an integer of 0 or 1.

In general formulas (a2-1) to (a2-5), R is the same as R in general formula (a1-0-1) for the structural unit (a1) above.

The lower alkyl group for R' is the same as the lower alkyl group for R in general formula (a1-0-1) for the structural unit (a1) above.

In the structural units represented by general formulas (a2-1) to (a2-5), in consideration of industrial availability, R' is preferably a hydrogen atom.

Specific examples of structural units represented by general formulas (a2-1) to (a2-5) above are shown below.

[Chemical Formula 30]

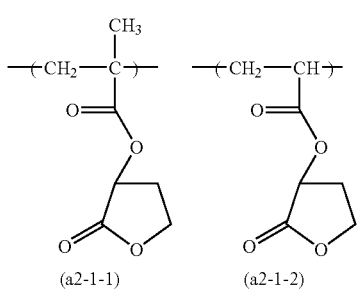
(a2-1-1)  (a2-1-2)

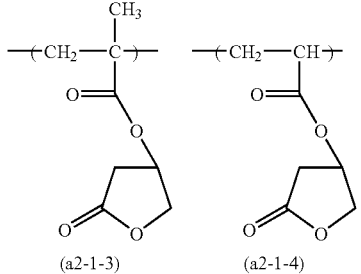
(a2-1-3)  (a2-1-4)

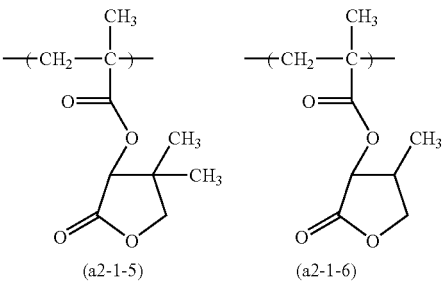
(a2-1-5)  (a2-1-6)

[Chemical Formula 31]

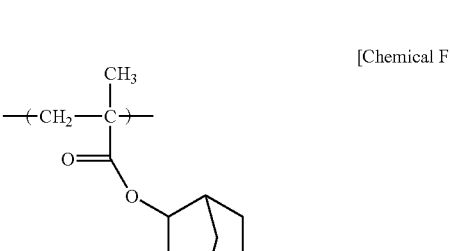
(a2-2-1)

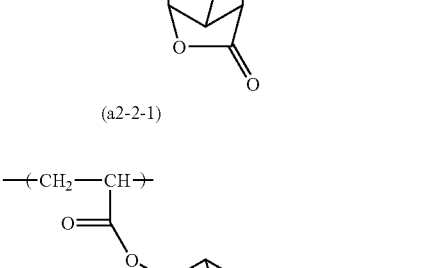
(a2-2-2)

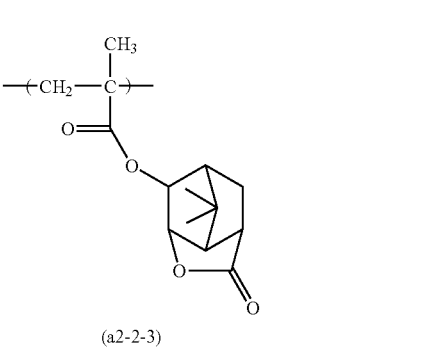
(a2-2-3)

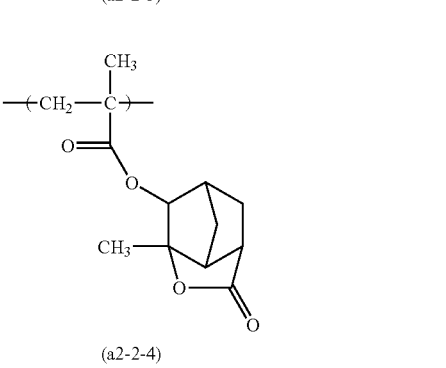
(a2-2-4)

-continued
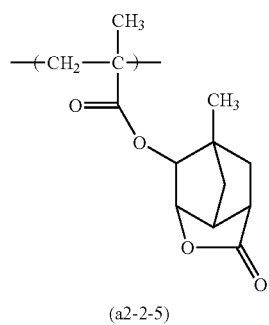
(a2-2-5)
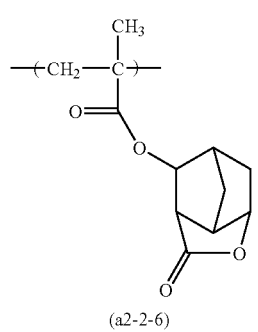
(a2-2-6)
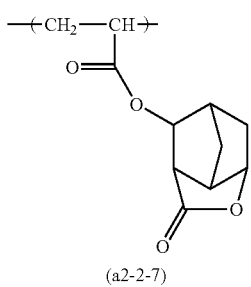
(a2-2-7)
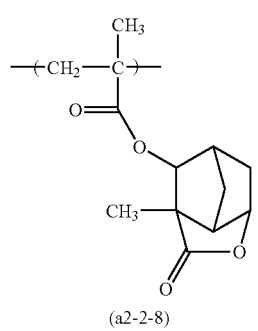
(a2-2-8)
[Chemical Formula 32]
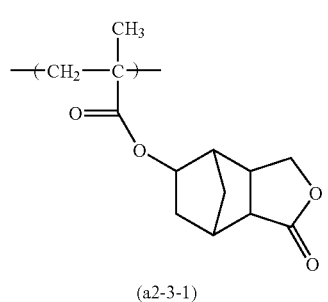
(a2-3-1)
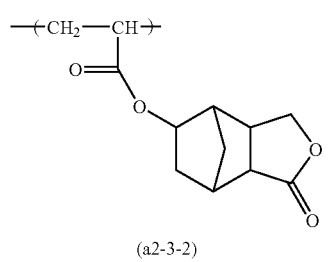
(a2-3-2)
-continued
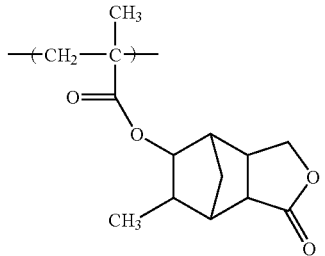
(a2-3-3)
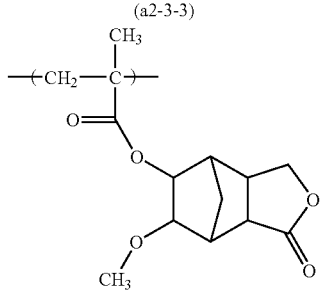
(a2-3-4)
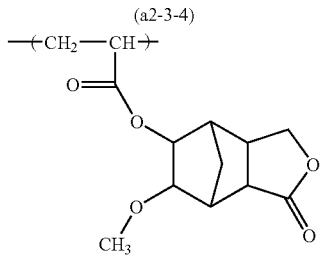
(a2-3-5)
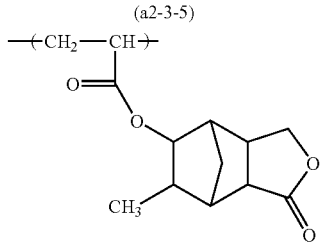
(a2-3-6)
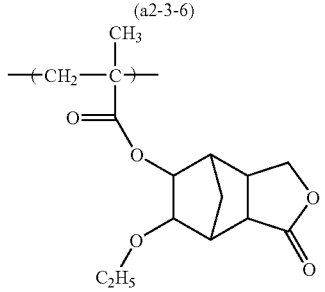
(a2-3-7)
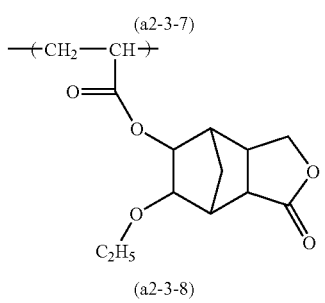
(a2-3-8)

-continued
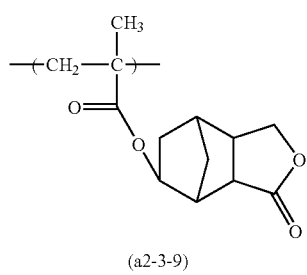
(a2-3-9)
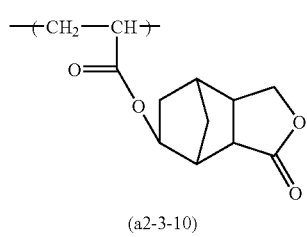
(a2-3-10)
[Chemical Formula 33]
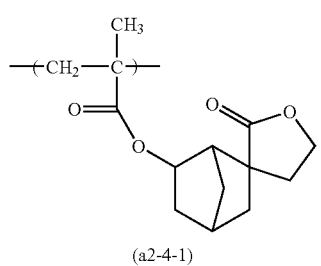
(a2-4-1)
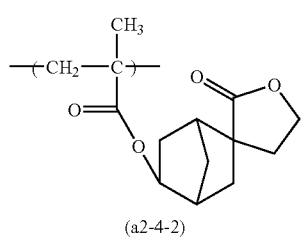
(a2-4-2)
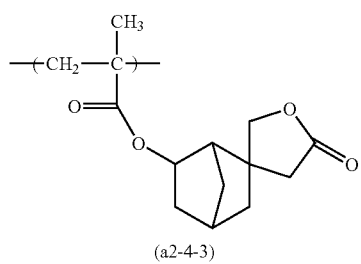
(a2-4-3)
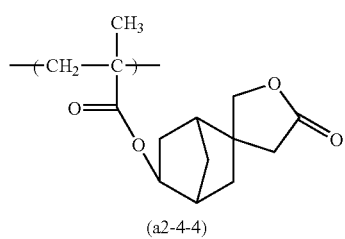
(a2-4-4)
-continued
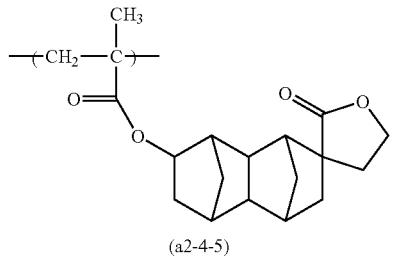
(a2-4-5)
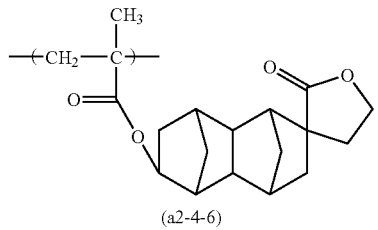
(a2-4-6)
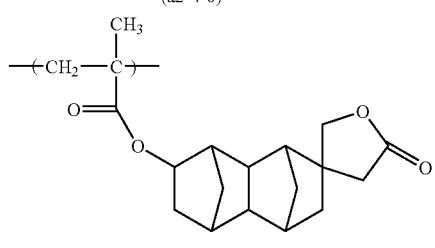
(a2-4-7)
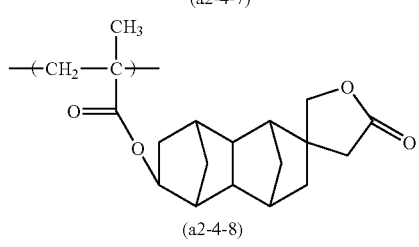
(a2-4-8)
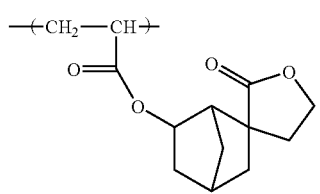
(a2-4-9)
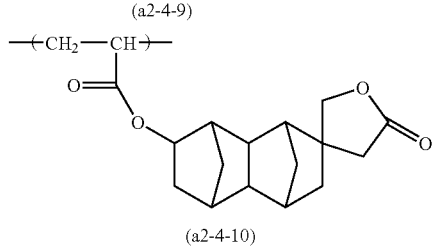
(a2-4-10)
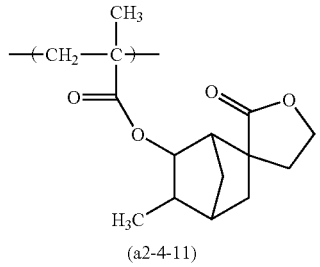
(a2-4-11)

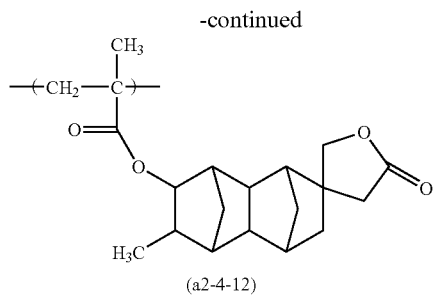

(a2-4-12)

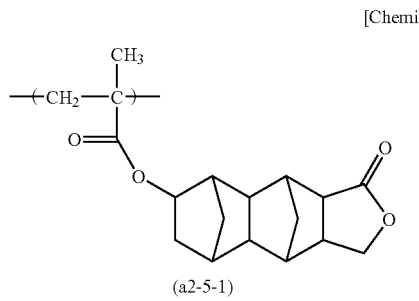

(a2-5-1)

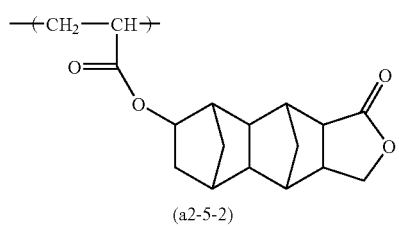

(a2-5-2)

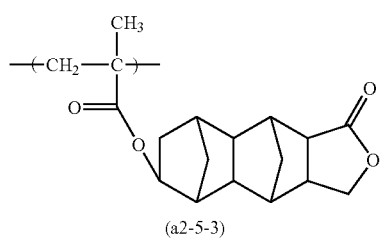

(a2-5-3)

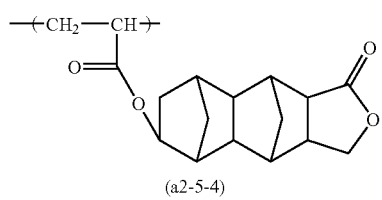

(a2-5-4)

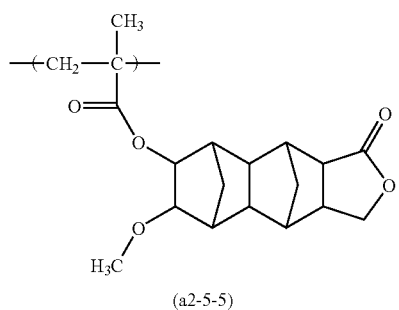

(a2-5-5)

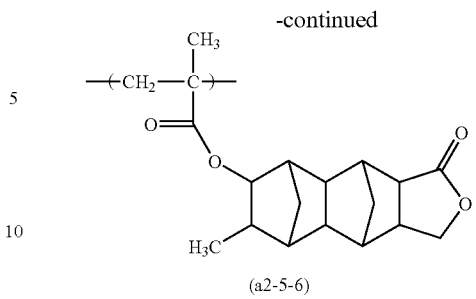

(a2-5-6)

In the structural units represented by general formulas (a2-1) to (a2-5), in consideration of industrial availability, R' is preferably a hydrogen atom.

Of these, at least one structural unit selected from the group consisting of structural units represented by general formulas (a2-1), (a2-2) and (a2-3) is preferable. Specifically, it is preferable to use at least one structural unit selected from the group consisting of formulas (a2-1-1), (a2-1-2), (a2-2-1), (a2-2-2), (a2-3-1), (a2-3-2), (a2-3-9) and (a2-3-10).

In the component (A), as the structural unit (a2), one type of structural unit may be used, or two or more types of structural units may be used in combination.

In the component (A), the amount of the structural unit (a2) based on the combined total of all structural units constituting the component (A) is preferably 5 to 60 mol %, more preferably 1 to 50 mol %, and still more preferably 20 to 50 mol %. By making the amount of the structural unit (a2) at least as large as 5 mol %, the effect of using the structural unit (a2) can be satisfactorily achieved. On the other hand, by making the amount of the structural unit (a2) no more than 60 mol %, a good balance can be achieved with the other structural units.

[Other Structural Units]

The component (A) may also have structural units which are other than the aforementioned structural units (a0-1), (a0-2), (a1) and (a2), as long as the effects of the present invention are not impaired. As the structural unit which is other than the above-mentioned structural units (a0-1), (a0-2), (a1) and (a2), any other structural unit which cannot be classified as one of the above structural units (a0-1), (a0-2), (a1) and (a2) can be used without any particular restrictions, and any of the multitude of conventional structural units used within resist resins for ArF excimer lasers or KrF excimer lasers (and particularly for ArF excimer lasers) can be used, as long as the effects of the present invention are not impaired.

As such structural units, structural units (a3) and (a4) shown below can be exemplified.

[Structural Unit (a3)]

The structural unit (a3) is a structural unit derived from an acrylate ester containing a polar group-containing aliphatic hydrocarbon group, and is not included in the aforementioned structural unit (a0-1) or (a0-2). The structural unit (a3) enhances the hydrophilicity of the component (A), and improves the compatibility of the component (A) with the developing solution. As a result, the alkali solubility of the exposed portions improves, which contributes to favorable improvements in the resolution.

Examples of the polar group include a hydroxyl group, a cyano group, a carboxyl group, or a hydroxyalkyl group in which a part of the hydrogen atoms of the alkyl group have been substituted with fluorine atoms (i.e., fluorinated alkylalcohol).

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that include an aliphatic polycyclic group (an aliphatic cyclic group which is polycyclic) that contains a hydroxyl group, a cyano group, a carboxyl group or a hydroxyalkyl group in which a part of the hydrogen atoms of the alkyl group have been substituted with fluorine atoms are particularly desirable. Examples of the polycyclic groups include groups in which one or more hydrogen atoms have been removed from a bicycloalkane, tricycloalkane, tetracycloalkane or the like. Specific examples include groups in which one or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by general formulas (a3-1) and (a3-2) shown below, and the like are preferable.

[Chemical Formula 35]

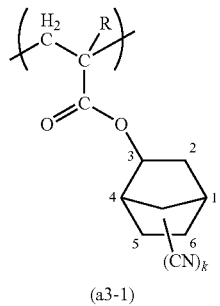

(a3-1)

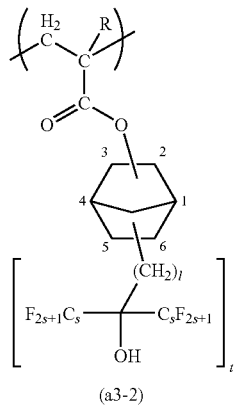

(a3-2)

wherein R represents a hydrogen atom, a halogen atom, a lower alkyl group or a halogenated lower alkyl group; k is an integer of 1 to 3; t' is an integer of 1 to 3; l is an integer of 1 to 5; and s is an integer of 1 to 3.

In general formulas (a3-1) and (a3-2), the halogen atom, lower alkyl group and halogenated lower alkyl group for R are the same as the halogen atom, lower alkyl group and halogenated lower alkyl group which can be bonded to the α-position of the aforementioned acrylate ester.

In formula (a3-1), k is preferably 1. The cyano group is preferably bonded to the 5th or 6th position of the norbonyl group.

In formula (a3-2), t' is preferably 1, l is preferably 1 and s is preferably 1. Further, it is preferable that a 2-norbonyl group or 3-norbonyl group be bonded to the terminal of the carboxy group of the acrylic acid. The fluorinated alkylalcohol (hydroxyalkyl group in which a part of the hydrogen atoms of the alkyl group has been substituted with fluorine atoms) is preferably bonded to the 5th or 6th position of the norbonyl group.

When the structural unit (a3) is included in the component (A), the amount of the structural unit (a3) based on the combined total of all structural units constituting the component (A) is preferably 1 to 30 mol %, more preferably 5 to 30 mol %, still more preferably 10 to 20 mol %.

[Structural Unit (a4)]

The structural unit (a4) is a structural unit derived from an acrylate ester containing a non-acid dissociable, aliphatic cyclic group.

Examples of the polycyclic group with the structural unit (a4) include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from among a tricyclodecanyl group, adamantyl group, tetracyclododecanyl group, isobornyl group, and norbormyl group is particularly desirable. These polycyclic groups may or may not have a substituent. As the substituent, a linear or branched alkyl group of 1 to 5 carbon atoms can be mentioned.

Specific examples of the structural unit (a4) include units with structures represented by general formulas (a4-1) to (a4-5) shown below.

[Chemical Formula 36]

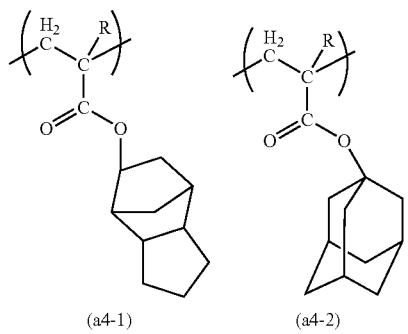

(a4-1)          (a4-2)

-continued

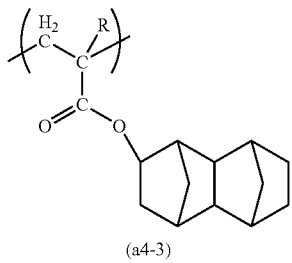

(a4-3)

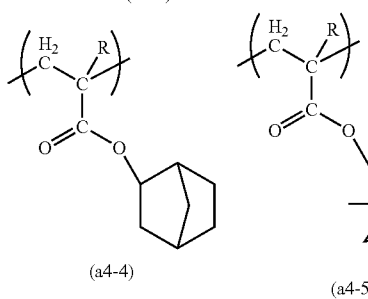

(a4-4)  (a4-5)

wherein R represents a hydrogen atom, a halogen atom, a lower alkyl group or a halogenated lower alkyl group.

In general formulas (a4-1) to (a4-5), the halogen atom, lower alkyl group and halogenated lower alkyl group for R are the same as the halogen atom, lower alkyl group and halogenated lower alkyl group which can be bonded to the α-position of the aforementioned acrylate ester.

When the structural unit (a4) is included in the component (A), the amount of the structural unit (a4) based on the combined total of all structural units constituting the component (A) is preferably 1 to 30 mol %, more preferably 10 to 20 mol %.

In the present invention, the component (A) includes at least the structural unit (a0-1) and the structural unit (a0-2).

In the present invention, the component (A) preferably contains a copolymer which has the aforementioned structural unit (a0-1) and structural unit (a0-2), and if desired, at least one of the structural units (a1), (a2), (a3) and (a4).

In the present invention, the component (A) preferably contains a copolymer which has at least the three structural units (a0-1), (a0-2) and (a1). Examples of such copolymers include a tertiary copolymer consisting of the aforementioned structural units (a0-1), (a0-2) and (a1), and a quaternary copolymer consisting of the aforementioned structural units (a0-1), (a0-2), (a1) and (a2).

In the present invention, it is particularly desirable that the component (A) contain at least one copolymer selected from the group consisting of a copolymer (A-11) which includes the combination of 4 structural units represented by general formula (A-11) shown below; a copolymer (A-12) which includes the combination of 4 structural units represented by general formula (A-12) shown below; and a copolymer (A-13) which includes the combination of 4 structural units represented by general formula (A-13) shown below. Among these, it is particularly desirable that the component (A) contain a copolymer (A-11) and/or a copolymer (A-12), and a copolymer (A-13).

[Chemical Formula 37]

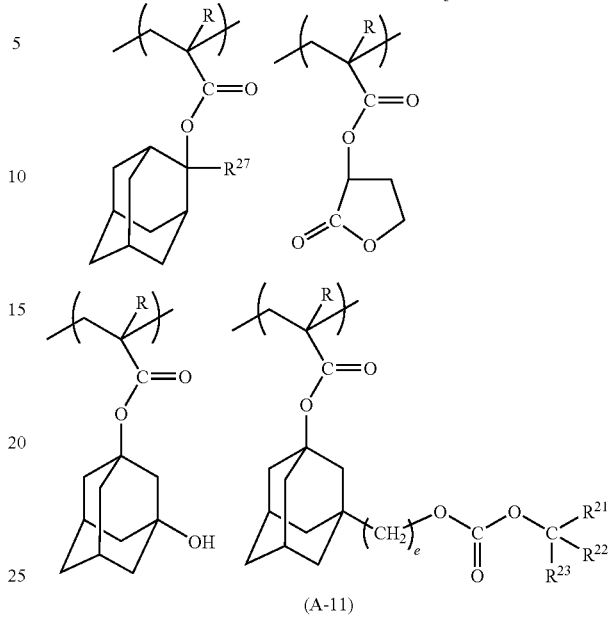

(A-11)

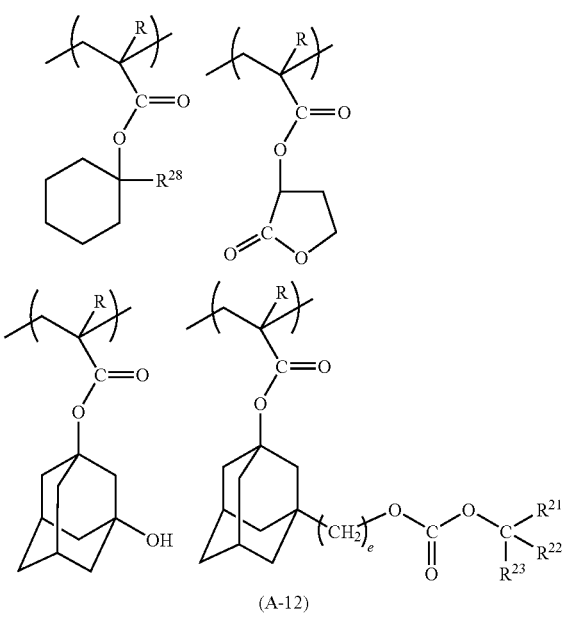

(A-12)

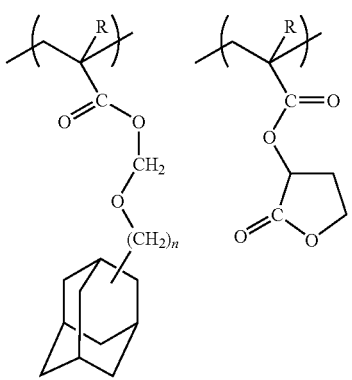

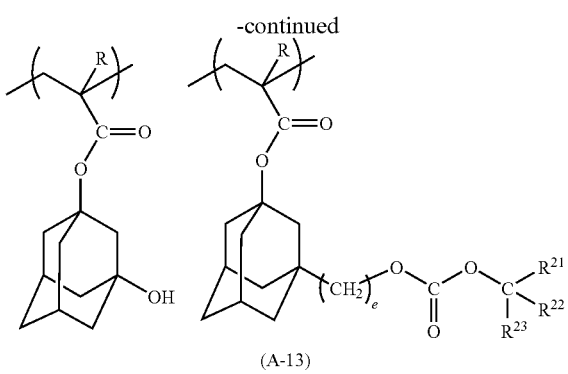

(A-13)

wherein:

in general formula (A-11), R and e are respectively as defined for R and e in general formula (a0-1) above, wherein the plurality of R may be the same or different; $R^{21}$ to $R^{23}$ are respectively as defined for $R^{21}$ to $R^{23}$ in general formula (I) above; and $R^{27}$ represents a lower alkyl group;

in general formula (A-12), R and e are respectively as defined for R and e in general formula (a0-1) above, wherein the plurality of R may be the same or different; $R^{21}$ to $R^{23}$ are respectively as defined for $R^{21}$ to $R^{23}$ in general formula (I) above; and $R^{28}$ represents a lower alkyl group; and in general formula (A-13), R and e are respectively as defined for R and e in general formula (a0-1) above, wherein the plurality of R may be the same or different; $R^{21}$ to $R^{23}$ are respectively as defined for $R^{21}$ to $R^{23}$ in general formula (I) above; and n is as defined for n in general formula (p1) above.

In general formula (A-11), as the lower alkyl group for $R^{27}$, the same as the lower alkyl group for R can be exemplified. As $R^{27}$, a methyl group or an ethyl group is preferable, and a methyl group is particularly desirable.

In general formula (A-12), as the lower alkyl group for $R^{28}$, the same as the lower alkyl group for R can be exemplified. As $R^{28}$, a methyl group or an ethyl group is preferable, and a methyl group is particularly desirable.

In general formula (A-13), n is preferably 0 or 1, and most preferably 0.

As the component (A), one type of resin may be used alone, or two or more types of resins may be used in combination.

The component (A), as described above, may contain one or more copolymers having both of the structural unit (a0-1) and the structural unit (a0-2). Alternatively, the component (A) may be a mixture of a polymer having at least the structural unit (a0-1) and a polymer having at least the structural unit (a0-2).

As the latter mixture, for example, a mixture of the aforementioned copolymer having both of the structural unit (a0-1) and the structural unit (a0-2) and a below-mentioned polymer (A2-1) and/or polymer (A2-2); and a mixture of the below-mentioned polymer (A2-1) and polymer (A2-2), can be exemplified.

Polymer (A2-1): a polymer having the structural unit (a0-2) and no structural unit (a0-1)

Polymer (A2-2): a polymer having the structural unit (a0-1) and no structural unit (a0-2)

As the polymer (A2-1), for example, a copolymer of the structural unit (a0-2) and at least one of the structural units (a1) to (a4) can be exemplified. Specific examples include a copolymer consisting of the structural units (a0-2) and (a1), and a copolymer consisting of the structural units (a0-2), (a1) and (a2). As such copolymers, copolymers consisting of three structural units represented by general formulas (A-11), (A-12) and (A-13) above excluding the structural unit corresponding to the structural unit (a0-1), can be mentioned.

As the polymer (A2-2), for example, a copolymer of the structural unit (a0-1) and at least one of the structural units (a1) to (a4) can be exemplified. Specific examples include a copolymer consisting of the structural units (a0-1) and (a1), and a copolymer consisting of the structural units (a0-1), (a1) and (a2). As such copolymers, copolymers consisting of three structural units represented by general formulas (A-11), (A-12) and (A-13) above excluding the structural unit corresponding to the structural unit (a0-2); and a copolymer represented by general formula (A2-21) shown below, can be exemplified.

[Chemical Formula 38]

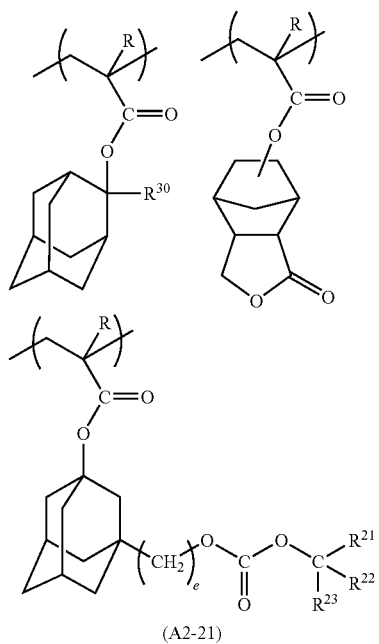

(A2-21)

In general formula (A2-21), R and e are respectively as defined for R and e in general formula (a0-1) above, wherein the plurality of R may the same or different; $R^{21}$ to $R^{23}$ are respectively as defined for $R^{21}$ to $R^{23}$ in general formula (I) above; and $R^{30}$ represents a lower alkyl group.

In general formula (A2-21), as the lower alkyl group for $R^{30}$, the same as the lower alkyl group for R can be exemplified. As $R^{30}$, a methyl group or an ethyl group is preferable, and a methyl group is particularly desirable.

The component (A) can be obtained, for example, by a conventional radical polymerization or the like of the monomers corresponding with each of the structural units, using a radical polymerization initiator such as azobisisobutyronitrile (AIBN).

Furthermore, in the component (A), by using a chain transfer agent such as HS—$CH_2$—$CH_2$—$CH_2$—$C(CF_3)_2$—OH, a —$C(CF_3)_2$—OH group can be introduced at the terminals of the component (A). Such a copolymer having introduced a hydroxyalkyl group in which a part of the hydrogen atoms of the alkyl group are substituted with fluorine atoms is effective in reducing LWR (line width roughness). Such a copolymer is also effective in reducing developing defects and LER (line edge roughness: unevenness of the side walls of a line pattern).

The weight average molecular weight (Mw) (the polystyrene equivalent value determined by gel permeation chromatography) of the component (A) is not particularly limited, but is preferably 2,000 to 50,000, more preferably 3,000 to 30,000, and most preferably 5,000 to 20,000. By making the weight average molecular weight no more than the upper limit of the above-mentioned range, the component (A) exhibits satisfactory solubility in a resist solvent when used as a resist. On the other hand, by making the weight average molecular weight at least as large as the lower limit of the above-mentioned range, dry etching resistance and cross-sectional shape of the resist pattern becomes satisfactory.

Further, the dispersity (Mw/number average molecular weight (Mn)) is preferably 1.0 to 5.0, more preferably 1.0 to 3.0, and most preferably 1.2 to 2.5. Here, Mn is the number average molecular weight.

<Component (B)>

As the component (B), there is no particular limitation, and any of the known acid generators used in conventional chemically amplified resist compositions can be used.

Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, a compound represented by general formula (b-0) shown below can be used.

[Chemical Formula 39]

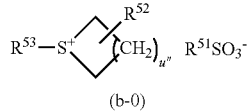

(b-0)

wherein $R^{54}$ represents a linear, branched or cyclic alkyl group, or a linear, branched or cyclic fluorinated alkyl group; $R^{52}$ represents a hydrogen atom, a hydroxyl group, a halogen atom, a linear or branched alkyl group, a linear or branched halogenated alkyl group, or a linear or branched alkoxy group; $R^{53}$ represents an aryl group which may have a substituent; and u" represents an integer of 1 to 3.

In general formula (b-0), $R^{51}$ represents a linear, branched or cyclic alkyl group, or a linear, branched or cyclic fluorinated alkyl group.

The linear or branched alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination ratio of the fluorinated alkyl group (percentage of the number of fluorine atoms substituting the hydrogen atoms, based on the total number of all hydrogen atoms within the alkyl group) is preferably from 10 to 100%, more preferably from 50 to 100%, and it is particularly desirable that all of the hydrogen atoms are substituted with fluorine atoms, as the acid strength increases.

$R^{51}$ is most preferably a linear alkyl group or a fluorinated alkyl group.

$R^{52}$ represents a hydrogen atom, a hydroxyl group, a halogen atom, a linear or branched alkyl group, a linear or branched halogenated alkyl group, or a linear or branched alkoxy group.

Examples of the halogen atom for R include a fluorine atom, a bromine atom, a chlorine atom and an iodine atom, and a fluorine atom is preferable.

The alkyl group for $R^{52}$ is linear or branched, and preferably has 1 to 5 carbon atoms, more preferably 1 to 4 carbon atoms, and most preferably 1 to 3 carbon atoms.

The halogenated alkyl group for $R^{52}$ is a group in which some or all of the hydrogen atoms of the alkyl group have been substituted with halogen atoms. As the alkyl group of the halogenated alkyl group, the same as the linear or branched alkyl group for $R^{52}$ may be mentioned. As the halogen atoms for substituting the hydrogen atoms of the alkyl group, the same as the halogen atom for $R^{52}$ may be mentioned. In the halogenated alkyl group, it is preferable that 50 to 100% of the hydrogen atoms of the alkyl group be substituted with halogen atoms, and it is more preferable that all of the hydrogen atoms are substituted with halogen atoms.

The alkoxy group for $R^{52}$ is linear or branched, and preferably has 1 to 5 carbon atoms, more preferably 1 to 4 carbon atoms, and most preferably 1 to 3 carbon atoms.

Among these, as $R^{52}$, a hydrogen atom is particularly desirable.

$R^{53}$ represents an aryl group which may have a substituent, and examples of the basic ring excluding the substituent include a naphthyl group, a phenyl group and an anthracenyl group. In terms of the effects of the present invention and absorption of exposure rays such as ArF excimer laser, a phenyl group is preferable.

Examples of the substituent include a hydroxyl group and a lower alkyl group (linear or branched, and preferably has 1 to 5 carbon atoms, and a methyl group is particularly desirable).

As the aryl group for $R^{53}$, those which do not have a substituent are preferable.

u" is an integer of 1 to 3, preferably 2 or 3, and it is particularly desirable that u" be 3.

As preferable examples of acid generators represented by general formula (b-0), the following can be mentioned.

[Chemical Formula 40]

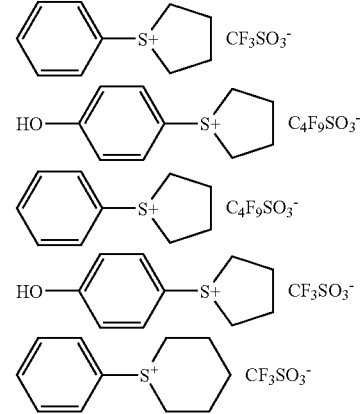

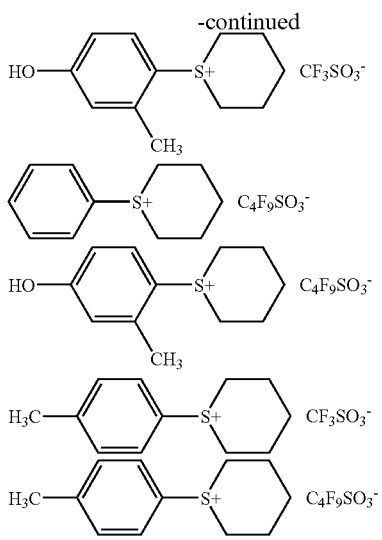

As an onium salt-based acid generator other than those represented by general formula (b-0), a compound represented by general formula (b-1) or (b-2) shown below can be mentioned.

[Chemical Formula 41]

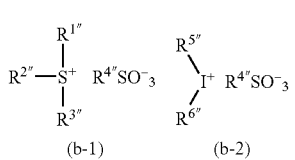

wherein $R^{1\prime\prime}$ to $R^{3\prime\prime}$, $R^{5\prime\prime}$ and $R^{6\prime\prime}$ each independently represents an aryl group or alkyl group; and $R^{4\prime\prime}$ represents a linear, branched or cyclic alkyl group or fluorinated alkyl group, with the proviso that at least one of $R^{1\prime\prime}$ to $R^{3\prime\prime}$ represents an aryl group, and at least one of $R^{5\prime\prime}$ and $R^{6\prime\prime}$ represents an aryl group.

In formula (b-1), $R^{1\prime\prime}$ to $R^{3\prime\prime}$ each independently represents an aryl group or an alkyl group. Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

The aryl group for $R^{1\prime\prime}$ to $R^{3\prime\prime}$ is not particularly limited. For example, an aryl group having 6 to 20 carbon atoms may be used in which some or all of the hydrogen atoms of the aryl group may or may not be substituted with alkyl groups, alkoxy groups, or halogen atoms.

The aryl group is preferably an aryl group having 6 to 10 carbon atoms because it can be synthesized at a low cost. Specific examples thereof include a phenyl group and naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, and most preferably a methoxy group or an ethoxy group.

The halogen atom, with which hydrogen atoms of the aryl group may be substituted, is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and a methyl group is most preferable because it is excellent in resolution and can be synthesized at a low cost.

It is preferable that each of $R^{1\prime\prime}$ to $R^{3\prime\prime}$ is a phenyl group or a naphthyl group, and it is particularly desirable that one of $R^{1\prime\prime}$ to $R^{3\prime\prime}$ is a phenyl group, and the other two are naphthyl groups.

$R^{4\prime\prime}$ represents a linear, branched or cyclic alkyl group or a fluorinated alkyl group.

The linear or branched alkyl group preferably has 1 to 10 carbon atoms, more preferably 1 to 8 carbon atoms, and most preferably 1 to 4 carbon atoms.

The cyclic alkyl group is preferably a cyclic group, as described for R''', having 4 to 15 carbon atoms, more preferably 4 to 10 carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. Further, the fluorination ratio of the fluorinated alkyl group (percentage of fluorine atoms within the alkyl group) is preferably from 10 to 100%, more preferably from 50 to 100%, and it is particularly desirable that all hydrogen atoms are substituted with fluorine atoms because the acid strength increases.

$R^{4\prime\prime}$ is most preferably a linear or cyclic alkyl group or a fluorinated alkyl group.

In formula (b-2), $R^{5\prime\prime}$ and $R^{6\prime\prime}$ each independently represents an aryl group or an alkyl group. At least one of $R^{5\prime\prime}$ and $R^{6\prime\prime}$ represents an aryl group. It is preferable that both of $R^{5\prime\prime}$ and $R^{6\prime\prime}$ represent an aryl group.

As the aryl group for $R^{5\prime\prime}$ and $R^{6\prime\prime}$, the same aryl groups as those for $R^{1\prime\prime}$ to $R^{3\prime\prime}$ can be mentioned.

As the alkyl group for $R^{5\prime\prime}$ and $R^{6\prime\prime}$, the same alkyl groups as those for $R^{1\prime\prime}$ to $R^{3\prime\prime}$ can be mentioned.

It is particularly desirable that both of $R^{5\prime\prime}$ and $R^{6\prime\prime}$ represents a phenyl group.

As $R^{4\prime\prime}$ in formula (b-2), the same $R^{4\prime\prime}$ as those mentioned above for $R^{4\prime\prime}$ in formula (b-1) can be mentioned.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; and di(1-naphthyl)phenylsulfonium trifluoromethanesulfonate, heptafluoropropanesulfonate or nonafluorobutanesulfonate. It is also possible to use onium salts in which the anion moiety of these onium salts are replaced by methanesulfonate, n-propanesulfonate, n-butanesulfonate, or n-octanesulfonate.

Further, onium salt-based acid generators in which the anion moiety in general formula (b-1) or (b-2) is replaced by an anion moiety represented by general formula (b-3) or (b-4) shown below (the cation moiety is the same cation as (b-1) or (b-2)) may also be used.

[Chemical Formula 42]

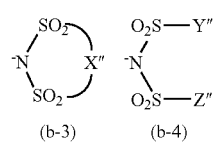

(b-3)    (b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The percentage of the fluorine atoms within the alkylene group or alkyl group, i.e., the fluorination ratio is preferably from 70 to 100%, more preferably from 90 to 100%, and it is particularly desirable that the alkylene group or alkyl group be a perfluoroalkylene or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 43]

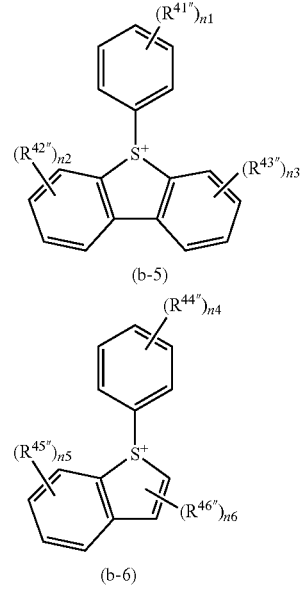

wherein $R^{41''}$ to $R^{46''}$ each independently represents an alkyl group, an acetyl group, an alkoxy group, a carboxy group, a hydroxyl group or a hydroxyalkyl group; $n_1$ to $n_5$ each independently represents an integer of 0 to 3; and $n_6$ represents an integer of 0 to 2.

With respect to $R^{41''}$ to $R^{46''}$, the alkyl group is preferably a lower alkyl group of 1 to 5 carbon atoms, more preferably a linear or branched alkyl group, and most preferably a methyl group, an ethyl group, a propyl group, an isopropyl group, an n-butyl group or a tert butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

$n_1$ is preferably 1 or 2, and more preferably 1.

It is preferable that $n_2$ and $n_3$ each independently represent 0 or 1, and more preferably 0.

$n_4$ is preferably 1 or 2, and more preferably 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include anion moieties ($R^{51}$—$SO_3^-$) for onium salt-based acid generators represented by general formula (b-0); anion moieties ($R^{4''}$—$SO_3^-$ for onium salt-based acid generators represented by general formula (b-1) or (b-2) shown above; and anion moieties represented by general formula (b-3) or (b-4) shown above.

Specific examples of sulfonium salts having a cation moiety represented by formula (b-5) or (b-6) are shown below.

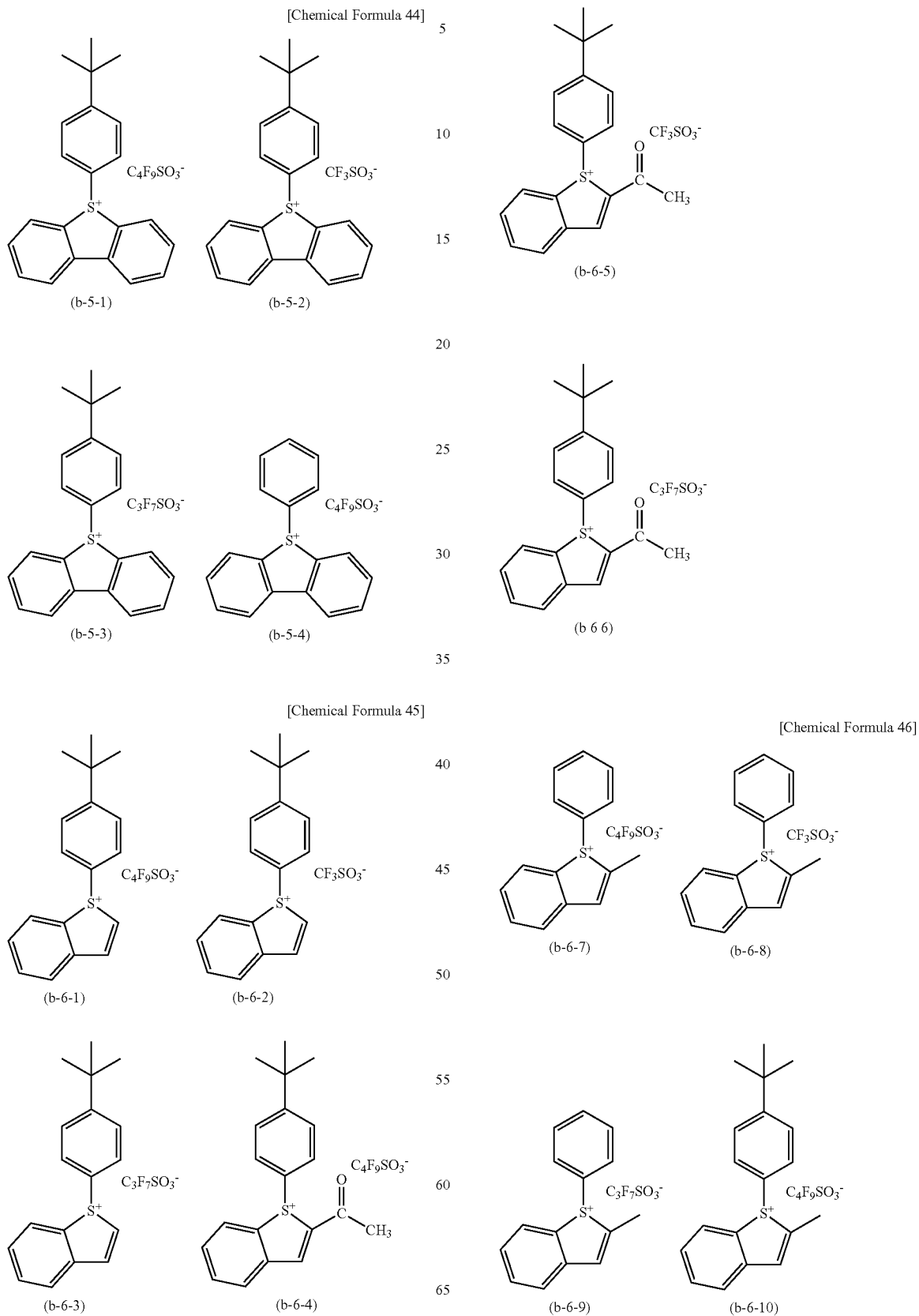

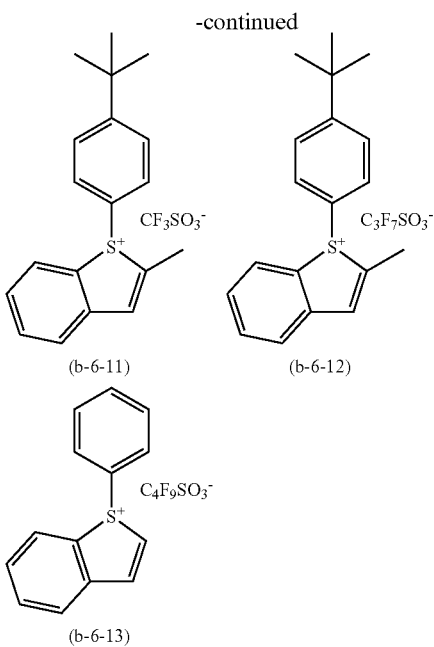

(b-6-11)   (b-6-12)

(b-6-13)

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

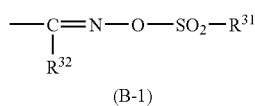

[Chemical Formula 47]

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^-$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ are the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

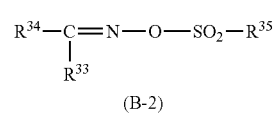

[Chemical Formula 48]

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

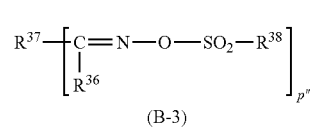

[Chemical Formula 49]

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and still more preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthracyl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a partially or completely fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulifonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyinino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonytoxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsolfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, as preferable examples, the following can be exemplified.

[Chemical Formula 50]

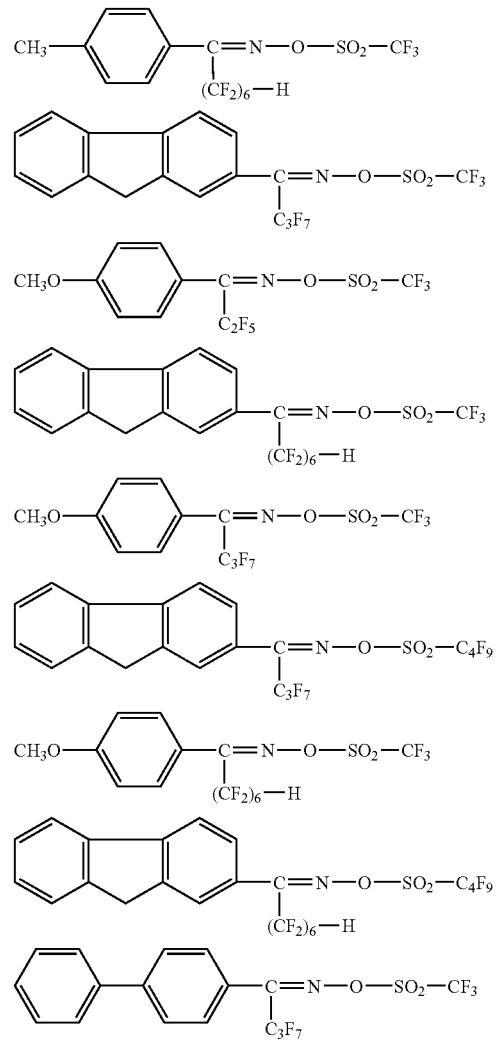

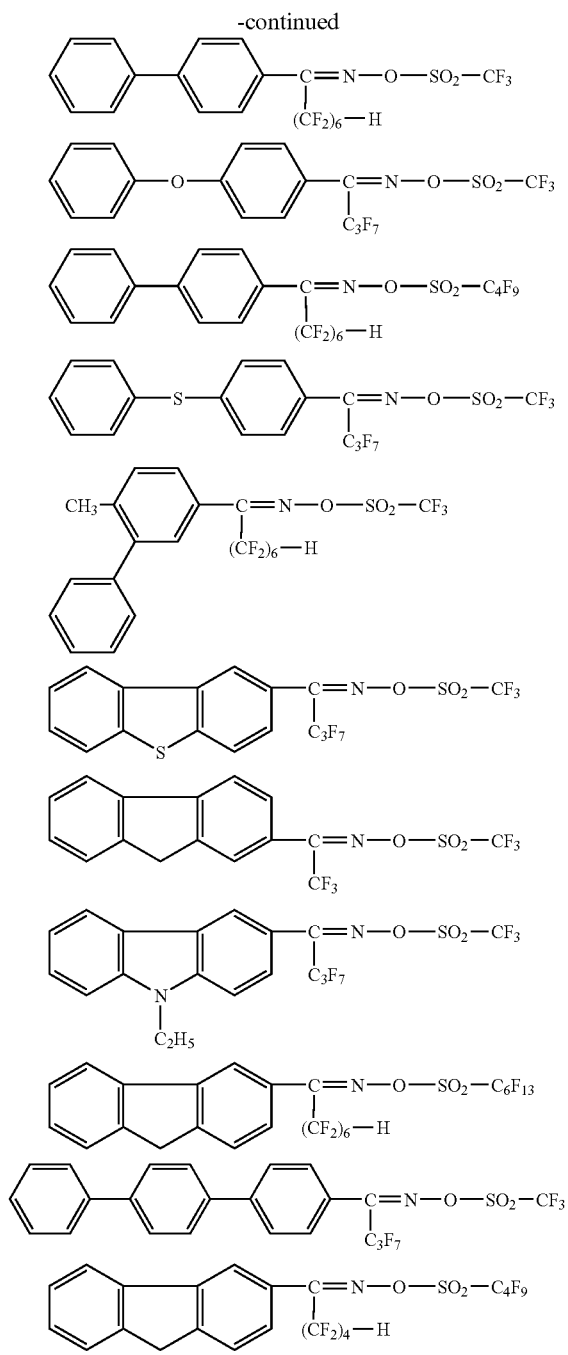

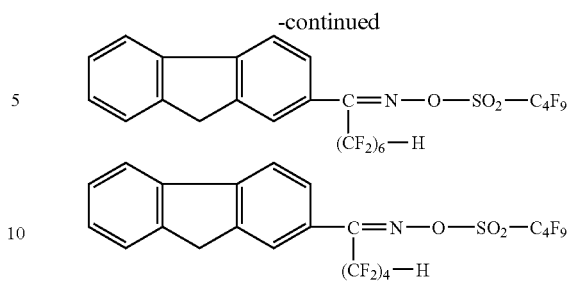

Further, as more preferable examples of oxime sulfonate-based acid generators, the following 4 compounds can be exemplified.

[Chemical Formula 51]

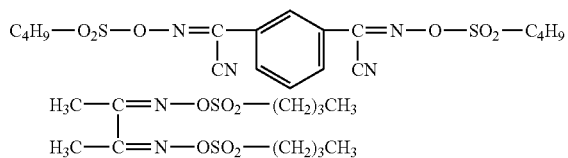

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be exemplified.

As the component (B), one type of these acid generators may be used alone, or two or more types may be used in combination.

In the present invention, as the component (B), it is particularly preferable to use an onium salt in which an anion is a fluorinated alkylsulfonate ion.

The amount of the component (B) within the positive resist composition of the present invention is preferably 0.5 to 30 parts by weight, more preferably 1 to 20 parts by weight, and most preferably 2 to 15 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

In the positive resist composition of the present invention, for improving the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although a cyclic amine, an aliphatic amine, and particularly a secondary aliphatic amine or tertiary aliphatic amine is preferable. Here, an aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of 1 to 12 carbon atoms (i.e., alkylamines or alkyl alcohol amines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

These compounds can be used either alone, or in combinations of two or more different compounds.

The component (D) is typically used in an amount within a range from 0.01 to 5.0 parts by weight, relative to 100 parts by weight of the component (A).

Furthermore, in the positive resist composition of the present invention, for preventing any deterioration in sensitivity, and improving the resist pattern shape and the post exposure stability of the latent image formed by the patternwise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid. Among these, salicylic acid is particularly preferable.

Examples of phosphorus oxo acids or derivatives thereof include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

Of these, one type may be used alone, or two or more types may be used in combination.

As the component (E), an organic carboxylic acid is preferable, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

The positive resist composition of the present invention can be prepared by dissolving the materials for the resist composition (the component (A), component (B), and if desired, the aforementioned optional components) in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-amyl ketone, methyl isoamyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, amylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition is within the range from 2 to 20% by weight, and preferably from 3 to 15% by weight.

<<Method of Forming a Resist Pattern>>

The method of forming a resist pattern according to the present invention includes: applying a positive resist composition of the present invention to a substrate to form a resist film on the substrate; subjecting the resist film to exposure; and developing the resist film to form a resist pattern.

More specifically, the method for forming a resist pattern according to the present invention can be performed, for example, as follows. Firstly, the resist composition is applied onto a substrate such as a silicon wafer using a spinner or the like, and a prebake (post applied bake (PAB)) is conducted at 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) at 80 to 150° C. for 40 to 120 seconds, preferably 60 to 90 seconds. Subsequently, developing is conducted using an alkali developing solution such as a 0.1 to 10% by weight aqueous solution of tetramethylanunonium hydroxide. In this manner, a resist pattern that is fail to the mask pattern can be obtained.

An organic or inorganic antireflection film may be provided between the substrate and the applied coating layer of the positive resist composition.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is particularly effective to ArF excimer laser.

The positive resist composition and method of forming a resist pattern according to the present invention is capable of achieving excellent solubility in an organic solvent and forming a resist pattern having an excellent shape.

Further, by the present invention, excellent lithography properties can be achieved with respect to sensitivity, resolution, line width roughness (LWR), mask error factor (MEF), exposure margin (EL margin), and the like.

The reason why the solubility in an organic solvent increases is presumed as follows.

Conventionally, in a positive resist composition used for ArF excimer laser lithography and the like, for the purpose of enhancing the compatibility with the developing solution and improving the alkali solubility of the exposed portions, a resin containing a polar group-containing aliphatic hydrocarbon group, e.g., a structural unit having the structure "—$Y^1$ (aliphatic cyclic group)-OH" have been used. However, such a resin containing a structural unit having the structure "—$Y^1$—OH" reduces the solubility of the resin in an organic solvent by its high hydrophilicity, and thus, the solubility of a positive resist composition containing such a resin in an organic solvent becomes poor.

In contrast, the resin used in the present invention contains a structural unit (a0-1) having the structure "—$Y^1$"—($CH_2$)$_e$—O—Z" (wherein $Y^1$, e and Z are respectively as defined for $Y^1$, e and Z in general formula (a0-1)). In this structure "—$Y^1$—($CH_2$)$_e$—O—Z", Z exhibits low polarity as compared to a hydrogen atom. Further, the molecular chain of this structure is relatively long. Therefore, it is presumed that the compatibility of the component (A) for an organic solvent is enhanced, and the solubility of the component (A) is improved.

Further, in the present invention, the reason why a resist pattern having an excellent shape can be formed is presumed that synergism of the structural unit (a0-1) with the structural unit (a0-2).

Furthermore, in the present invention, the same or higher level of lithography properties can be achieved by replacing a part or all of the structural unit (a2) with the structural unit (a0-1). As a result, the amount of the structural unit (a2) can be reduced without changing the amount of the structural unit (a0-2). When the amount of the structural unit (a0-2) is at the same level, the Tg of the component (A) becomes higher as the amount of the structural unit (a2) becomes lower. It is presumed that the increase of Tg contributes to suppressing the softening of the resist film during baking after exposure, suppressing the diffusion of the acid generated upon exposure, and improvement in the rectangularity of the resist pattern.

Moreover, in the present invention, a resist pattern having an excellent shape can be formed in which generation of defects is suppressed.

Conventionally, in the fields of lithography, a problem arises in that defects are generated on the surface of the formed resist pattern. "Defects" refers to general abnormalities of a resist pattern, which are detected when observed from directly above the developed resist pattern, using, for example, surface defect detection equipment (trade name: "KLA") manufactured by KLA-TENCOR CORPORATION. Examples of these abnormalities include post-developing scum, foam, dust, bridges across different portions of the resist pattern, color irregularities, and foreign deposits. Improvements in the defect problem are becoming more and more important as the demand for resist patterns with higher resolution is increasing. Especially, in lithography techniques using ArF excimer lasers and lithography techniques developed thereafter such as lithography techniques using $F_2$ excimer lasers, EUV, electron beam (EB) and the like as the light source, when a fine pattern such as a resist pattern of no more than 130 nm is formed, these defects are becoming of serious problems.

One of the reasons for defects is presumed to be the poor solubility in an organic solvent and the low stability of the resist solution due to such poor solubility. The positive resist composition of the present invention exhibits excellent solubility in an organic solvent, and is therefore effective in solving the problems of defects.

EXAMPLES

As follows is a description of examples of the present invention, although the scope of the present invention is by no way limited by these examples.

(A)-1 to (A)-7 used in Examples 1 to 7 and Comparative Example 1 were synthesized in Synthesis Examples 2 to 9 by copolymerizing monomers (1) to (9) shown below (the production method of monomer (1) is shown below) by a conventional dropwise polymerization method.

In Synthesis Examples 2 to 9, Mw and Mw/Mn of (A)-1 to (A)-8 were measured by gel permeation chromatography (GPC).

In Synthesis Examples 2 to 9, each of the subscript numerals at the lower right of the brackets in formulas (A)-1 to (A)-8 indicate the amount (mol %) of the respective structural units.

[Chemical Formula 52]

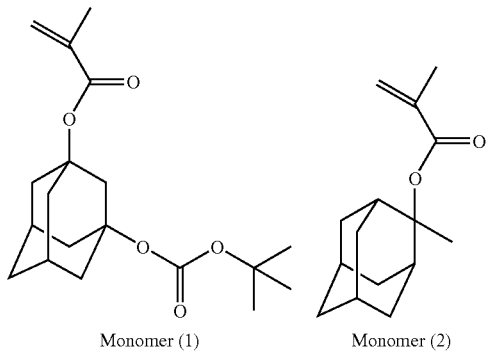

Monomer (1)  Monomer (2)

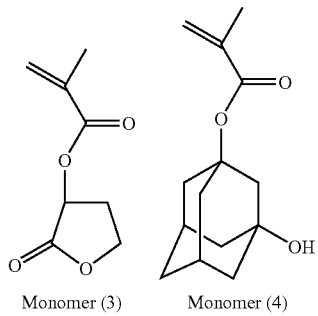

Monomer (3)  Monomer (4)

[Chemical Formula 53]

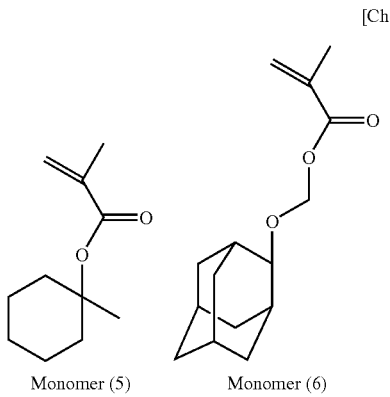

Monomer (5)  Monomer (6)

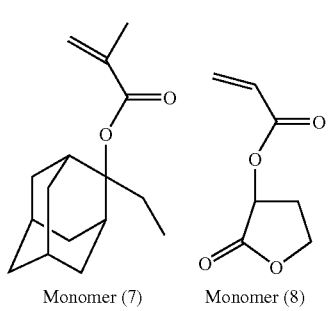

Monomer (7)  Monomer (8)

-continued

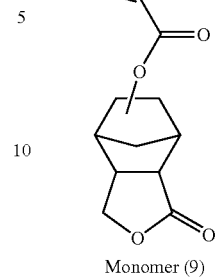

Monomer (9)

Synthesis Example 1

Synthesis of Monomer (1)

150 mL of THF (tetrahydrofuran) were charged into an eggplant-shaped flask, and 20 g of the monomer (4) above (1-(3-hydroxyadamantyl)methacrylate) and 10 g of triethylamine were added thereto. Then, 22 g of t-butoxycarboxylic acid anhydride were added while cooling with ice, and the resultant was stirred at room temperature for 3 hours. Thereafter, the reaction liquid was subjected to extraction with ethyl acetate, followed by concentration, thereby obtaining the monomer (1) above.

Synthesis Example 2

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 17.3 g of monomer (1), 45.1 g of monomer (2), 30.6 g of monomer (3), 24.3 g of monomer (4), 154 g of PGMEA and 2.9 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C., under reduced pressure for about 40 hours, thereby obtaining a resin (A)-1.

The obtained resin (A)-1 was subjected to GPC measurement. As a result, it was found that the weight average molecular weight (Mw) was 7,000, and the dispersity (Mw/Mn) was 1.7.

[Chemical Formula 54]

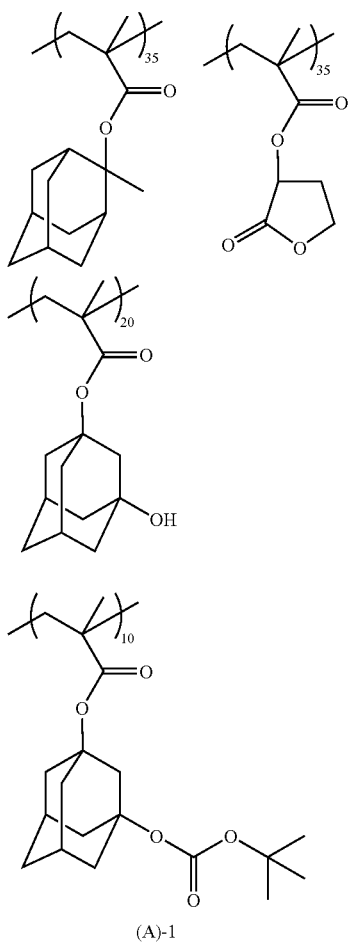

(A)-1

Synthesis Example 3

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 37.9 g of monomer (1), 49.3 g of monomer (2), 23.9 g of monomer (3), 26.6 g of monomer (4), 155 g of PGMEA and 3.2 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-2.

The obtained resin (A)-2 was subjected to GPC measurement. As a result, it was found that the weight average molecular weight (Mw) was 7,000, and the dispersity (Mw/Mn) was 1.7.

[Chemical Formula 55]

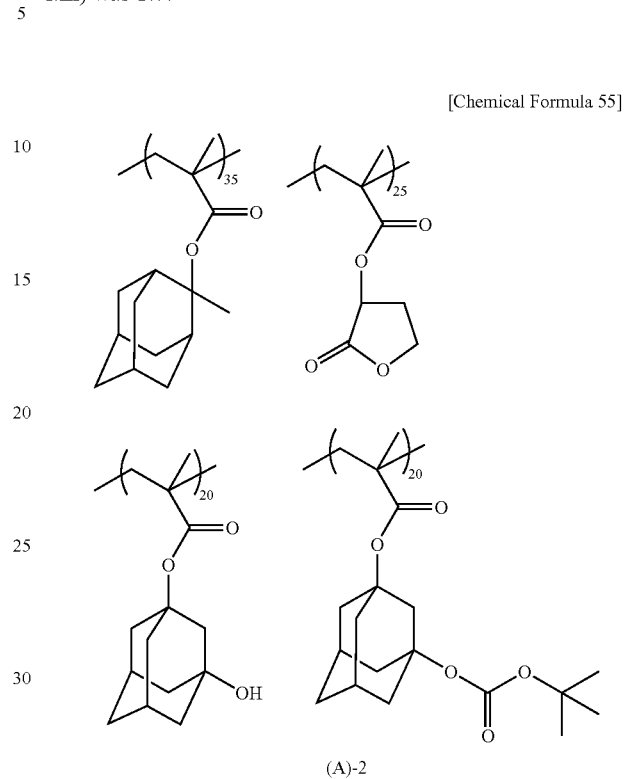

(A)-2

Synthesis Example 4

86 g of PGMEA were charged into a flask equipped with an inlet for nitrogen, a stirrer, a condenser and a thermometer in a nitrogen atmosphere, and the temperature of the water bath was elevated to 80° C. while stirring A monomer solution obtained by mixing 17.9 g of monomer (1), 46.6 g of monomer (2), 40.7 g of monomer (3), 12.6 g of monomer (4), 155 g of PGMEA and 3.1 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-3.

The obtained resin (A)-3 was subjected to GPC measurement. As a result, it was found that the weight average molecular weight (Mw) was 7,000, and the dispersity (Mw/Mn) was 1.7.

[Chemical Formula 56]

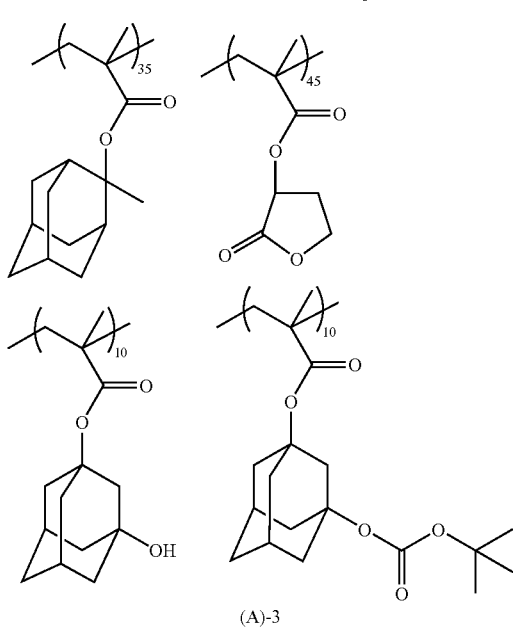

(A)-3

Synthesis Example 5

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 41.4 g of monomer (2), 36.2 g of monomer (3), 22.3 g of monomer (4), 155 g of PGMEA and 2.7 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-4.

The obtained resin (A)-4 was subjected to GPC measurement. As a result, it was found that the weight average molecular weight (Mw) was 7,000, and the dispersity (Mw/Mn) was 1.5.

[Chemical Formula 57]

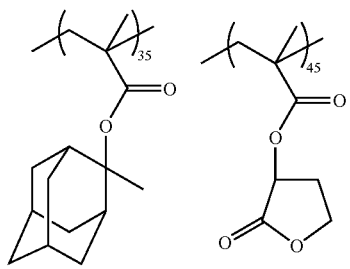

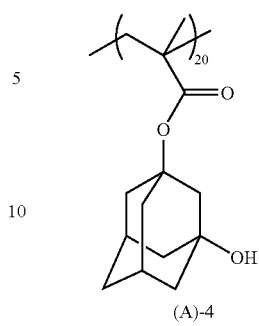

(A)-4

Synthesis Example 6

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 20.4 g of monomer (1), 44.3 g of monomer (3), 20.4 g of monomer (4), 155 g of PGMEA and 3.5 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-5.

The obtained resin (A)-5 was subjected to GPC measurement. As a result, it was found that the weight average molecular weight (Mw) was 10,000, and the dispersity (Mw/Mn) was 1.7.

[Chemical Formula 58]

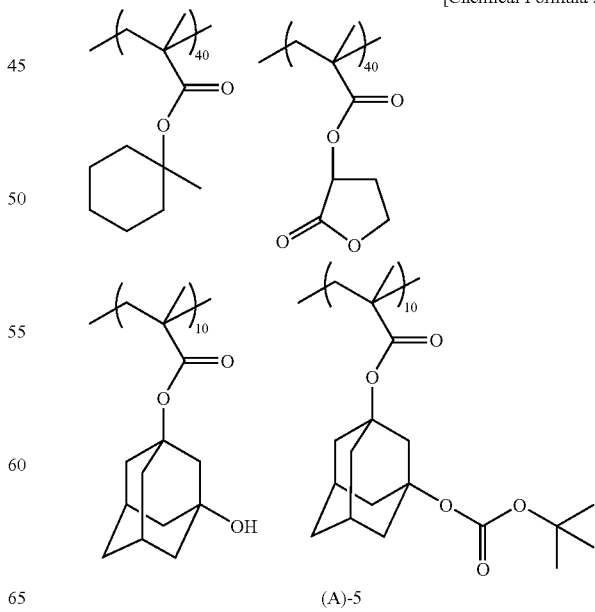

(A)-5

Synthesis Example 7

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 18.1 g of monomer (1), 53.8 g of monomer (2), 33.5 g of monomer (8), 12.7 g of monomer (4), 155 g of PGMEA and 3.1 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-6.

The obtained resin (A)-6 was subjected to GPC measurement. As a result, it was found that the weight average molecular weight (Mw) was 10,000, and the dispersity (Mw/Mn) was 1.7.

Synthesis Example 8

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 15.8 g of monomer (1), 52.9 g of monomer (6), 35.9 g of monomer (3), 11.1 g of monomer (4), 155 g of PGMEA and 2.7 g of 2,2'-azobisisobutyronitrile (AIBN) were added dropwise into the flask using a dripping apparatus at a constant rate over 6 hours, and then the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-7.

The obtained resin (A)-7 was subjected to GPC measurement. As a result, it was found that the weight average molecular weight (Mw) was 7,000, and the dispersity (Mw/Mn) was 1.6.

[Chemical Formula 59]

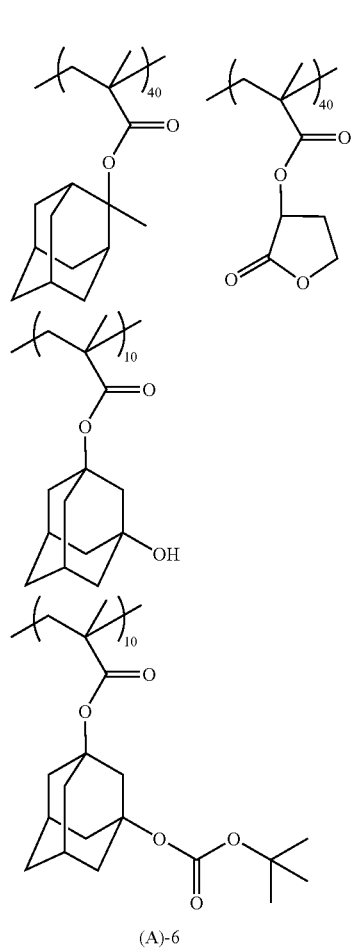

(A)-6

[Chemical Formula 60]

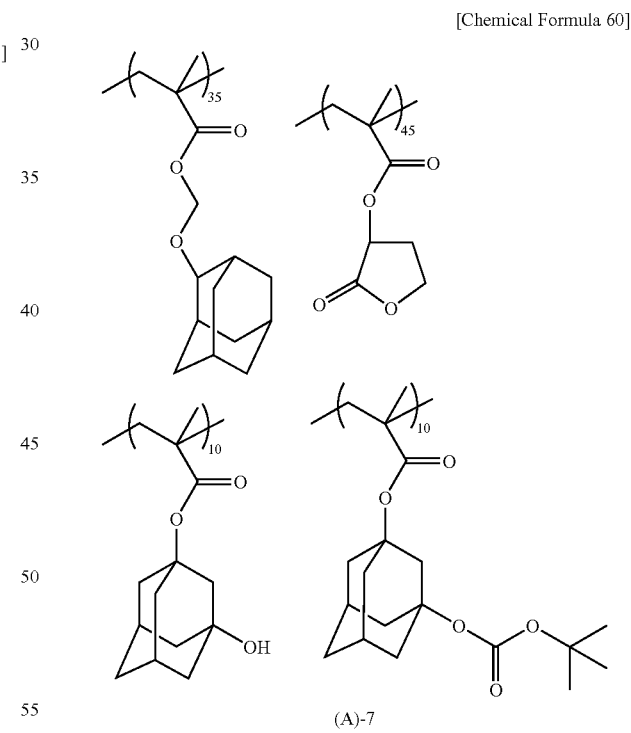

(A)-7

Synthesis Example 9

86 g of PGMEA were charged into a flask equipped with an inlet for nitrogen, a stirrer, a condenser and a thermometer in a nitrogen atmosphere, and the temperature of the water bath was elevated to 80° C. while stirring. A monomer solution obtained by mixing 25.7 g of monomer (1), 37.9 g of monomer (7), 36.4 g of monomer (9), 155 g of PGMEA and 2.1 g of 2,2'-azobisisobutyronitrile (AIBN) were added dropwise into the flask using a dripping apparatus at a constant rate over 6 hours, and the temperature was maintained at 80° C. for 1 hour. Then, the temperature of the reaction liquid was cooled to room temperature. Subsequently, the resulting reaction liquid was added dropwise to methanol about 30 times in amount while stirring, to obtain a colorless precipitate. The obtained precipitate was subjected to filtration, and then the precipitate was washed in methanol in an amount about 30 times the amount of the monomers used in the polymerization. The resulting precipitate was subjected to filtration, followed by drying at 50° C. under reduced pressure for about 40 hours, thereby obtaining a resin (A)-8.

The obtained resin (A)-8 was subjected to GPC measurement. As a result, it was found that the weight average molecular weight (Mw) was 10,000, and the dispersity (Mw/Mn) was 1.6.

[Chemical Formula 61]

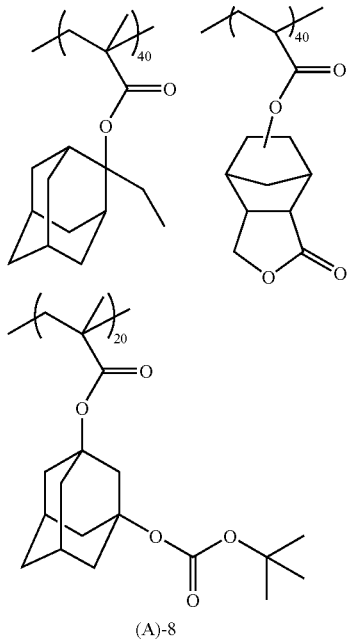

(A)-8

<<Evaluation of Solubility in Organic Solvent>>

With respect to resins (A)-1 to (A)-4, the solubility thereof in an organic solvent was evaluated in the following manner.

As the organic solvent, a mixed solvent of PGMEA/PGME=6/4 (weight ratio) was used, and each of (A)-1 to (A)-4 was dissolved in an amount of 1 g in 12 g of the mixed solvent (23° C.).

As a result, it was found that (A)-1 to (A)-3 dissolved instantly after they were added to the mixed solvent.

On the other hand, (A)-4 could not be easily dissolved. Even when the mixed solvent was stirred while subjecting to a ultrasonic wave treatment, about 30 minutes was necessary for (A)-4 to be completely dissolved.

In each of (A)-1 and (A)-2, the amount of the structural unit derived from the monomer (4) was the same as that in (A)-4, i.e., the amount of hydroxyl groups contained in each of (A)-1 and (A)-2 was the same as that in (A)-4. Nevertheless, (A)-1 and (A)-2 exhibited an excellent solubility in an organic solvent.

Further, (A)-3 is a resin in which a half of the structural unit derived from the monomer (4) within (A)-4 have been replaced by the structural unit derived from the monomer (1). Like (A)-1 and (A)-2, (A)-3 exhibited an excellent solubility in an organic solvent.

Subsequently, with respect to each of resins (A)-5 to (A)-8, a mixture of (A)-5 and (A)-7 ((A)-5:(A)-7=50:50 (weight ratio)) and a mixture of (A)-6 and (A)-8 ((A)-6:(A)-8=50:50 (weight ratio)), the solubility thereof in an organic solvent was evaluated in the same manner as described above.

As a result, it was found that each of the resins exhibited an excellent solubility in an organic solvent.

Examples 1 to 7

Comparative Example 1

The components shown in Table 1 were mixed together and dissolved to obtain positive resist compositions.

TABLE 1

|  | Component (A) | | Component (B) | | Component (D) | Component (E) | Component (S) | |
| --- | --- | --- | --- | --- | --- | --- | --- | --- |
| Example 1 | (A)-1 | — | (B)-1 | — | (D)-1 | (E)-1 | (S)-1 | (S)-2 |
|  | [100] |  | [13.0] |  | [0.54] | [1.32] | [10.0] | [2000] |
| Example 2 | (A)-2 | — | (B)-1 | — | (D)-1 | (E)-1 | (S)-1 | (S)-2 |
|  | [100] |  | [13.0] |  | [0.54] | [1.32] | [10.0] | [2000] |
| Example 3 | (A)-3 | — | (B)-1 | — | (D)-1 | (E)-1 | (S)-1 | (S)-2 |
|  | [100] |  | [13.0] |  | [0.54] | [1.32] | [10.0] | [2000] |
| Example 4 | (A)-4 | (A)-6 | (B)-1 | (B)-2 | (D)-1 | (E)-1 | — | (S)-2 |
|  | [50] | [50] | [6.0] | [4.0] | [0.40] | [1.50] |  | [2000] |
| Example 5 | (A)-4 | (A)-6 | (B)-3 | (B)-4 | (D)-1 | (E)-1 | — | (S)-2 |
|  | [50] | [50] | [3.0] | [5.0] | [0.40] | [1.50] |  | [2000] |
| Example 6 | (A)-5 | (A)-7 | (B)-1 | (B)-2 | (D)-1 | (E)-1 | — | (S)-2 |
|  | [50] | [50] | [6.0] | [4.0] | [0.40] | [1.50] |  | [2000] |
| Example 7 | (A)-3 | (A)-7 | (B)-1 | (B)-2 | (D)-1 | (E)-1 | — | (S)-2 |
|  | [50] | [50] | [6.0] | [4.0] | [0.40] | [1.50] |  | [2000] |

TABLE 1-continued

|  | Component (A) | Component (B) | Component (D) | Component (E) | Component (S) | |
|---|---|---|---|---|---|---|
| Comparative Example 1 | (A)-4 [100] | (B)-1 [13.0] | (D)-1 [0.54] | (E)-1 [1.32] | (S)-1 [10.0] | (S)-2 [2000] |

In Table 1, the reference characters indicate the following. Further, the values in brackets [ ] indicate the amount (in terms of parts by weight) of the component added.
(B)-1: a compound represented by formula (B)-1 shown below
(B)-2: a compound represented by formula (B)-2 shown below
(B)-3: a compound represented by formula (B)-3 shown below
(B)-4: a compound represented by formula (B)-4 shown below
(D)-1: tri-n-pentylamine
(E)-1: salicylic acid
(S)-1: γ-butyrolactone
(S)-2: a mixed solvent of PGMEA/PGME = 6/4 (weight ratio)

[Chemical Formula 62]

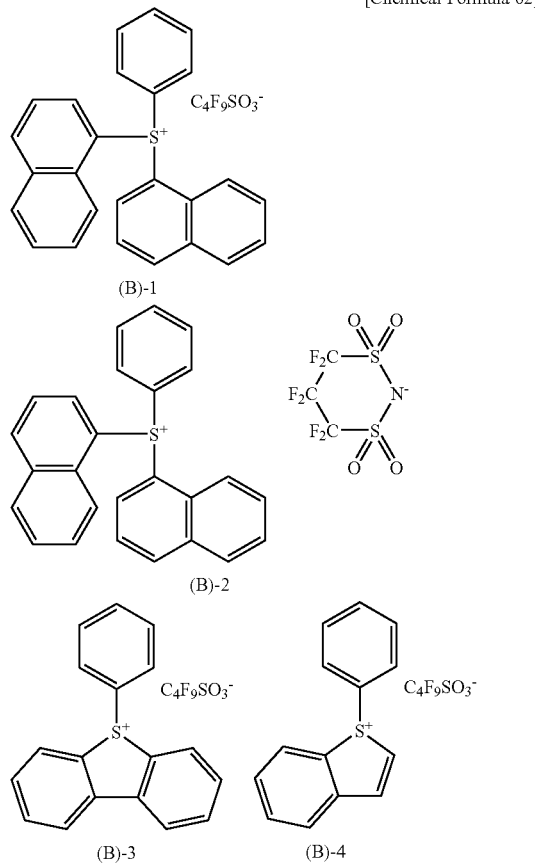

With respect to each of the positive resist compositions, a resist pattern was formed in the following manner, and lithography properties were evaluated.

An organic anti-reflection film composition (product name: ARC-29A, manufactured by Brewer Science Ltd.) was applied onto an 8-inch silicon wafer using a spinner, and the composition was then baked at 205° C. for 60 seconds, thereby forming an organic anti-reflection film having a film thickness of 77 nm. Then, a positive resist composition was applied onto the anti-reflection film using a spinner, and was then prebaked (PAB) on a hotplate at a temperature indicated in Table 2 for 60 seconds and dried, thereby forming a resist film having a film thickness of 150 nm.

Subsequently, the resist film was selectively irradiated with an ArF excimer laser (193 nm) through a mask pattern (6% half tone rectile), using an ArF exposure apparatus NSR—S-302 (manufactured by Nikon Corporation, NA (numerical aperture)=0.60, ⅔ annular illumination). Thereafter, a post exposure bake (PEB) treatment was conducted at the temperature indicated in Table 2 for 60 seconds, followed by development for 30 seconds at 23° C. in a 2.38% by weight aqueous solution of tetramethylammonium hydroxide (TMAH). Then, the resist was washed for 30 seconds with pure water, followed by drying by shaking.

As a result, in each of the examples using the respective positive resist compositions, a line and space pattern (hereafter referred to as "LS pattern") having a line width of 120 nm and a pitch of 240 nm was formed.

<Evaluation of Sensitivity>

In the evaluation of pattern formability described above, the optimum exposure dose (Eop) (unit: $mJ/cm^2$ (amount of energy per unit area)) with which a LS pattern having a line width of 120 nm and a pitch of 240 mm was formed was determined. As a result, it was found that the Eop was substantially the same in Examples 1 to 7 and Comparative Example 1.

<Evaluation of Resolution>

With the above Eop, LS patterns were formed in the same manner as described above, except that the mask size was changed so as to target LS patterns with line widths of 140 nm, 130 mm, 120 nm and 110 nm (wherein the ratio of the line width to the space width is 1:1).

As a result, in each of Examples 1 to 7 and Comparative Example 1, a LS pattern having a line width of 110 nm and a pitch of 220 nm could be resolved.

<Evaluation of Pattern Shape>

The cross-sectional shape of the LS patterns formed in the evaluation of resolution above were observed using a measuring SEM (product name: S-9220, manufactured by Hitachi, Ltd.).

As a result, with respect to the LS patterns formed in Examples 1 to 7, it was found that the perpendicularity of the side walls of the patterns was high, and the patterns exhibited high rectangularity, and hence, the cross-sectional shape was excellent.

On the other hand, with respect to the LS pattern formed in Comparative Example 1, it was found that the cross-sectional shape was slightly tapered, and the rectangularity was low. Further, with respect to the LS pattern having a line width of 110 nm and a pitch of 220 nm, the exposed portions were not completely removed, and hence, the removability of the pattern was unsatisfactory.

<Evaluation of Line Width Roughness (LWR)>

With respect to a LS pattern having a line width of 120 nm and a pitch of 240 nm formed with the above Eop, 5 points in the lengthwise direction of the line were measured using a measuring SEM (product name: S-9220, manufactured by Hitachi, Ltd.; measurement voltage: 300V), and from the results, the value of 3 times the standard deviation s (3 s; unit: nm) was calculated as a yardstick of LWR. The results are shown in Table 2. The smaller this 3 s value is, the lower the level of roughness of the line width, indicating that a resist pattern with a uniform width was obtained.

As seen from the results shown in Table 2, in Examples 1 to 7, the LWR was about the same or higher level as the LWR in Comparative Example 1. Especially, in Examples 4 and 5 in which the resin (A)-4 and the resin (A)-6 were used in combination, the LWR was particularly good. Further, in Example 6 in which the resin (A)-5 and the resin (A)-7 were used in combination, the LWR was good.

TABLE 2

|  | PAB temperature (C. °) | PEB temperature (C. °) | LWR (nm) |
| --- | --- | --- | --- |
| Example 1 | 105 | 105 | 10.4 |
| Example 2 | 105 | 105 | 9.9 |
| Example 3 | 105 | 105 | 9.6 |
| Example 4 | 110 | 110 | 7.8 |
| Example 5 | 110 | 110 | 9.1 |
| Example 6 | 105 | 100 | 9.5 |
| Example 7 | 105 | 100 | 10.2 |
| Comparative Example 1 | 105 | 105 | 10.3 |

<Evaluation of Mask Error Factor (MEF)>

With the above-mentioned Eop, LS patterns were formed using a mask pattern targeting a LS pattern having a line width of 130 nm and a pitch of 260 nm and a mask pattern targeting a LS pattern having a line width of 120 nm and a pitch of 260 nm. With respect to the formed LS patterns, the MEF was determined by the following formula.

$$MEF = |CD_{130} - CD_{120}| / |MD_{130} - MD_{120}|$$

In this formula, $CD_{130}$ and $CD_{120}$ represent the respective line widths (nm) of the actual LS patterns respectively formed using the mask pattern targeting a line width of 130 nm and the mask pattern targeting a line width of 120 nm, and $MD_{130}$ and $MD_{120}$ represent the respective target line widths (nm), meaning $MD_{130} = 130$ and $MD_{120} = 120$. The closer the MEF value is to 1, the better the mask reproducibility of the resist pattern formed.

As a result, it was found that in each of Examples 1 to 7 and Comparative Example 1, the MEF was about the same level.

<Evaluation of Mask Linearity>

With the above Eop, the LS ratio (ratio of the line width to the space width) of the mask pattern was fixed to 1:1, and the mask size (line width) was changed to 110 nm, 120 nm, 130 nm, 140 nm and 150 nm, to form LS patterns. The size (line width) of the formed LS patterns was measured. The closer the resist pattern size measured is to the mask size, i.e., the smaller the difference between the resist pattern size measured and the mask size is, it indicates that a resist pattern faithful to the mask pattern was formed. As a result, it was found that in each of Examples 1 to 7 and Comparative Example 1, the mask linearity was about the same level.

<Evaluation of Exposure Margin (EL Margin)>

Using a mask pattern targeting a LS pattern having a line width of 120 nm and a pitch of 240 nm, a LS pattern was formed while changing the exposure dose within the range of the above Eop±5%, and the variation in the line width of the LS pattern per exposure dose of 1 mJ (unit: nm/mJ) was determined.

The larger this variation (EL margin) is, the smaller the variation in the pattern size depending on the variation in the exposure dose.

As a result, it was found that in each of Examples 1 to 7 and Comparative Example 1, the EL margin was about the same level.

As seen from the results shown above, in each of Examples 1 to 7 in which the positive resist composition of the present invention was used, the component (A) used exhibited an extremely high solubility in an organic solvent, and a resist pattern having an excellent shape could be formed. Further, in Examples 1 to 7, various lithography properties (sensitivity, resolution, LWR, MEF, EL, and the like) were the same or higher level as that in Comparative Example 1.

On the other hand, in Comparative Example 1, the solubility of the component (A) in an organic solvent was poor, and the rectangularity of the resist pattern was low.

INDUSTRIAL APPLICABILITY

According to the present invention, there are provided a positive resist composition which exhibits excellent solubility in an organic solvent and is capable of forming a resist pattern having an excellent shape, and a method of forming a resist pattern. Therefore, the present invention is extremely useful in industry.

The invention claimed is:

1. A positive resist composition comprising a resin component (A) which exhibits increased alkali solubility under action of acid and an acid-generator component (B) which generates acid upon exposure, said resin component (A) comprising a structural unit (a0-1) represented by general formula (a0-1) shown below and a structural unit (a0-2) represented by general formula (a0-2) shown below:

[Chemical Formula 1]

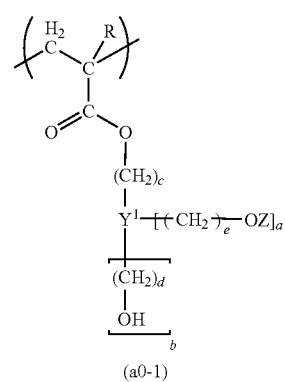

(a0-1)

-continued

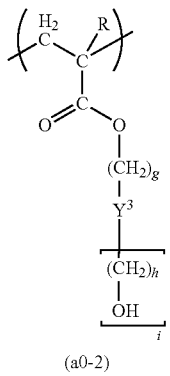

(a0-2)

wherein:
in general formula (a0-1), R represents a hydrogen atom, a halogen atom, a lower alkyl group or a halogenated lower alkyl group; $Y^1$ represents an aliphatic cyclic group; Z represents a tertiary alkyl group-containing group; a represents an integer of 1 to 3, and b represents an integer of 0 to 2, with the proviso that a+b=1 to 3; and each of c, d and e independently represents an integer of 0 to 3, and in general formula (a0-2), R represents a hydrogen atom, a halogen atom, a lower alkyl group or a halogenated lower alkyl group; $Y^3$ represents an aliphatic cyclic group; each of g and h independently represents an integer of 0 to 3; and i represents an integer of 1 to 3.

2. The positive resist composition according to claim 1, wherein the amount of said structural unit (a0-1) within said resin component (A), based on the combined total of all structural units constituting said resin component (A) is 1 to 40 mol %.

3. The positive resist composition according to claim 1, wherein said resin component (A) further comprises a structural unit (a1) derived from an acrylate ester having an acid dissociable, dissolution inhibiting group.

4. The positive resist composition according to claim 1, wherein said resin component (A) further comprises a structural unit (a2) derived from an acrylate ester having a lactone-containing cyclic group.

5. The positive resist composition according to claim 3, wherein said resin component (A) further comprises a structural unit (a2) derived from an acrylate ester having a lactone-containing cyclic group.

6. The positive resist composition according to claim 1, which further comprises a nitrogen-containing organic compound (D).

7. A method of forming a resist pattern, comprising: applying the positive resist composition of claim 1 to a substrate to form a resist film on the substrate; subjecting said resist film to exposure; and developing said resist film to form a resist pattern.

8. A positive resist composition comprising a resin component (A) which exhibits increased alkali solubility under action of acid and an acid-generator component (B) which generates acid upon exposure,
said resin component (A) comprising a structural unit (a0-1) represented by general formula (a0-1) shown below and a structural unit (a0-2) represented by general formula (a0-2) shown below:

[Chemical Formula 1]

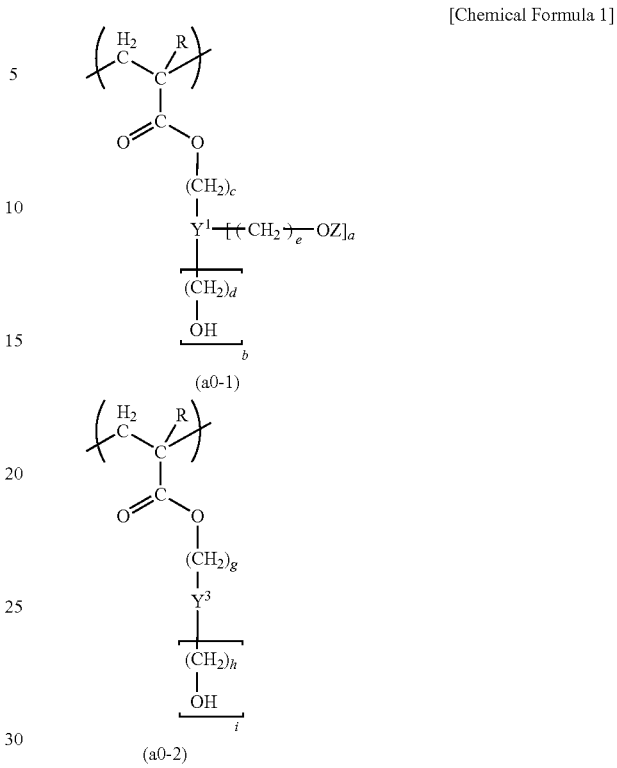

wherein:
in general formula (a0-1), R represents a hydrogen atom, a halogen atom, a lower alkyl group or a halogenated lower alkyl group; $Y^1$ represents an aliphatic cyclic group; Z represents a tertiary alkyl group-containing group or an alkoxyalkyl group; a represents an integer of 1 to 3, and b represents an integer of 0 to 2, with the proviso that a+b=1 to 3; and each of c, d and e independently represents an integer of 0 to 3, and in general formula (a0-2), R represents a hydrogen atom, a halogen atom, a lower alkyl group or a halogenated lower alkyl group; $Y^3$ represents an aliphatic cyclic group; each of g and h independently represents an integer of 0 to 3; and i represents an integer of 1 to 3, and said resin component (A) further comprises a structural unit (a1) derived from an acrylate ester having an acid dissociable, dissolution inhibiting group.

9. The positive resist composition according to claim 8, wherein the amount of said structural unit (a0-1) within said resin component (A), based on the combined total of all structural units constituting said resin component (A) is 1 to 40 mol %.

10. The positive resist composition according to claim 8, wherein said resin component (A) further comprises a structural unit (a2) derived from an acrylate ester having a lactone-containing cyclic group.

11. The positive resist composition according to claim 8, which further comprises a nitrogen-containing organic compound (D).

12. A method of forming a resist pattern, comprising: applying a positive resist composition of claim 8 to a substrate to form a resist film on the substrate; subjecting said resist film to exposure; and developing said resist film to form a resist pattern.

13. A positive resist composition comprising a resin component (A) which exhibits increased alkali solubility under action of acid and an acid-generator component (B) which generates acid upon exposure, said resin component (A) comprising a structural unit (a0-1) represented by general formula (a0-1) shown below and a structural unit (a0-2) represented by general formula (a0-2) shown below:

[Chemical Formula 1]

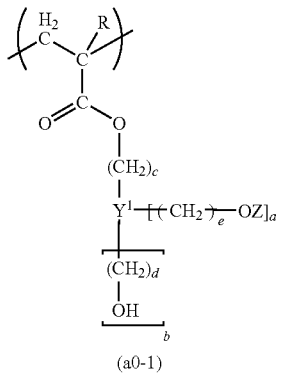

(a0-1)

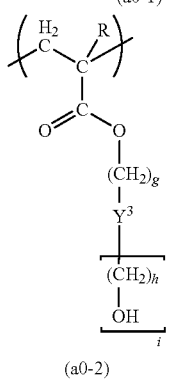

(a0-2)

wherein:

in general formula (a0-1), R represents a hydrogen atom, a halogen atom, a lower alkyl group or a halogenated lower alkyl group; $Y^1$ represents an aliphatic cyclic group; Z represents a tertiary alkyl group-containing group or an alkoxyalkyl group; a represents an integer of 1 to 3, and b represents an integer of 0 to 2, with the proviso that a+b=1 to 3; and each of c, d and e independently represents an integer of 0 to 3, and in general formula (a0-2), R represents a hydrogen atom, a halogen atom, a lower alkyl group or a halogenated lower alkyl group; $Y^3$ represents an aliphatic cyclic group; each of g and h independently represents an integer of 0 to 3; and i represents an integer of 1 to 3, and said resin component (A) further comprises a structural unit (a2) derived from an acrylate ester having a lactone-containing cyclic group.

14. The positive resist composition according to claim 13, wherein the amount of said structural unit (a0-1) within said resin component (A), based on the combined total of all structural units constituting said resin component (A) is 1 to 40 mol %.

15. The positive resist composition according to claim 13, which further comprises a nitrogen-containing organic compound (D).

16. A method of forming a resist pattern, comprising: applying a positive resist composition of claim 13 to a substrate to form a resist film on the substrate; subjecting said resist film to exposure; and developing said resist film to form a resist pattern.

* * * * *

UNITED STATES PATENT AND TRADEMARK OFFICE
CERTIFICATE OF CORRECTION

| | |
|---|---|
| PATENT NO. | : 7,776,511 B2 |
| APPLICATION NO. | : 12/299523 |
| DATED | : August 17, 2010 |
| INVENTOR(S) | : Takeshita et al. |

It is certified that error appears in the above-identified patent and that said Letters Patent is hereby corrected as shown below:

Column 1, Lines 20-27, Below "pattern." delete "Priority is claimed on Japanese Patent Application No. 2006-145285, filed May 25, 2006, and Japanese Patent Application No. 2006-244293, filed Sep. 8, 2006, the contents of which are incorporated herein by reference.

Priority is claimed on Japanese Patent Application No. 2006-145285, filed May 25, 2006, and Japanese Patent Application No. 2006-244293, filed Sep. 8, 2006, the contents of which are incorporated herein by reference.".

Column 5 Line 43 Change "mono cyclic" to --monocyclic--.

Column 7 Line 3 Change "chain-Like" to --chain-like--.

Column 15 Line 2-3 Change "preferably" to --(preferably--.

Column 15 Line 4 Change "$R^{17}$" to --$R^{17}$.--.

Column 50 Line 30 (Approx.) Change "1" to --10--.

Column 52 Line 42 Change "norbormyl" to --norbornyl--.

Column 57 Line 45 (Approx.) Change "$R^{54}$" to --$R^{51}$--.

Column 59 Line 44 Change "$R^{1'''}$" to --$R^{1'''}$--.

Column 60 Line 24 Change "R'''," to --$R^{1'''}$,--.

Column 66 Line 17 Change "R⁻," to --$R^{31}$,--.

Column 67 Line 50 Change "chlorobenzenesulifonyloxyimino)" to --chlorobenzenesulfonyloxyimino)--.

Column 67 Line 53 Change "toluenesulfonyloxyinino)" to --toluenesulfonyloxyimino)--.

Column 67 Line 56 Change "(methylsulfonytoxyimino)" to --(methylsulfonyloxyimino)--.

Column 67 Line 67 Change "(ethylsolfonyloxyimino)" to --(ethylsulfonyloxyimino)--.

Column 73 Line 31 Change "tetramethylanunonium" to --tetramethylammonium--.

Column 73 Line 32 Change "fail" to --faithful--.

Signed and Sealed this
Twenty-first Day of August, 2012

David J. Kappos
*Director of the United States Patent and Trademark Office*

CERTIFICATE OF CORRECTION (continued)
U.S. Pat. No. 7,776,511 B2

Column 76 Line 60 (Approx.) Change "50° C.," to --50° C.--.

Column 78 Line 43 Change "stirring" to --stirring.--.

Column 86 Line 36 (Approx.) Change "240 mm" to --240 nm--.

Column 86 Line 45 Change "130 mm," to --130 nm,--.

Column 87 Line 8 Change "(3 s;" to --(3s;--.

Column 87 Line 10 Change "3 s" to --3s--.